US011105629B2

(12) United States Patent
Torimoto

(10) Patent No.: US 11,105,629 B2
(45) Date of Patent: Aug. 31, 2021

(54) PHYSICAL QUANTITY SENSOR, COMPOSITE SENSOR, INERTIAL MEASUREMENT UNIT, VEHICLE POSITIONING DEVICE, PORTABLE ELECTRONIC DEVICE, ELECTRONIC DEVICE, VEHICLE, TRAVELING SUPPORTING SYSTEM, AND DISPLAY DEVICE

(71) Applicant: Seiko Epson Corporation, Tokyo (JP)

(72) Inventor: Tatsuro Torimoto, Matsumoto (JP)

(73) Assignee: Seiko Epson Corporation

( * ) Notice: Subject to any disclaimer, the term of this patent is extended or adjusted under 35 U.S.C. 154(b) by 126 days.

(21) Appl. No.: 16/438,543

(22) Filed: Jun. 12, 2019

(65) Prior Publication Data

US 2019/0383610 A1 Dec. 19, 2019

(30) Foreign Application Priority Data

Jun. 13, 2018 (JP) .............................. JP2018-112872

(51) Int. Cl.
*G01C 19/56* (2012.01)
*G01P 15/125* (2006.01)
(Continued)

(52) U.S. Cl.
CPC ......... *G01C 19/56* (2013.01); *G01C 19/5607* (2013.01); *G01C 19/5642* (2013.01);
(Continued)

(58) Field of Classification Search
CPC ... G01P 15/125; G01P 15/18; G01C 19/5719; G01C 19/56; G01C 19/5607; G01C 19/5649; G01C 19/5642
(Continued)

(56) References Cited

U.S. PATENT DOCUMENTS 6,979,873 B2 * 12/2005 Fujii .................... B81B 7/0058
257/417
7,109,727 B2 * 9/2006 Hayakawa ............ G01P 15/125
324/679
(Continued)

FOREIGN PATENT DOCUMENTS

JP 2007-327820 A 12/2007
JP 2011-129612 A 6/2011
(Continued)

OTHER PUBLICATIONS

Jacob Fraden, Handbook of Modern Sensors, Springer, Chapter 8, Apr. 2010, pp. 327-338 (Year: 2010).*
(Continued)

*Primary Examiner* — Clayton E. LaBalle
*Assistant Examiner* — Kevin C Butler
(74) *Attorney, Agent, or Firm* — Harness, Dickey & Pierce, P.L.C.

(57) ABSTRACT

An acceleration sensor functioning as a physical quantity sensor includes an acceleration sensor element including a substrate, a lid joined to the substrate to form a housing space in the inside, and an acceleration sensor element piece housed in the housing space and capable of detecting a physical quantity, and a circuit element bonded to, by an adhesive material, an upper surface on the opposite side of the acceleration sensor element piece side of the lid. A recess is provided along the outer edge of the lid in an outer edge region of the upper surface of the lid.

10 Claims, 20 Drawing Sheets

(51) Int. Cl.
  *G01P 15/18* (2013.01)
  *G01C 19/5719* (2012.01)
  *G01C 19/5607* (2012.01)
  *G01C 19/5642* (2012.01)
  *G01C 19/5649* (2012.01)
  *G01C 21/16* (2006.01)

(52) U.S. Cl.
  CPC ..... *G01C 19/5649* (2013.01); *G01C 19/5719* (2013.01); *G01P 15/125* (2013.01); *G01P 15/18* (2013.01); *G01C 21/16* (2013.01)

(58) Field of Classification Search
  USPC ...................................................... 73/504.12
  See application file for complete search history.

(56) References Cited

U.S. PATENT DOCUMENTS

| | | | | |
|---|---|---|---|---|
| 7,111,513 B2 * | 9/2006 | Sugiura | ............. | G01C 19/5719 73/504.12 |
| 7,132,722 B2 * | 11/2006 | Ohashi | ............. | G01P 15/0802 257/415 |
| 7,178,400 B2 * | 2/2007 | Murata | ............. | G01C 19/5719 73/514.16 |
| 7,201,053 B2 * | 4/2007 | Yoshioka | ............. | G01P 15/0802 73/504.12 |
| 7,243,545 B2 * | 7/2007 | Sakai | ............. | G01P 15/125 73/514.32 |
| 7,243,561 B2 * | 7/2007 | Ishigami | ............. | B60C 23/0408 73/511 |
| 7,267,002 B2 * | 9/2007 | Itakura | ............. | G01D 5/24 324/670 |
| 7,272,974 B2 * | 9/2007 | Goto | ............. | G01P 1/023 361/280 |
| 7,291,825 B2 * | 11/2007 | Tsuruhara | ............. | G01C 19/56 250/214 A |
| 7,302,847 B2 * | 12/2007 | Ito | ............. | G01C 19/5719 73/504.12 |
| 7,325,457 B2 * | 2/2008 | Fujimori | ............. | B60C 23/0408 361/283.1 |
| 7,432,724 B2 * | 10/2008 | Goto | ............. | G01R 27/2605 324/658 |
| 7,464,592 B2 * | 12/2008 | Ohta | ............. | G01P 1/006 73/504.17 |
| 7,505,245 B2 * | 3/2009 | Yokoyama | ............. | B81C 1/00952 361/272 |
| 7,595,548 B2 * | 9/2009 | Shirasaka | ............. | B81B 7/0077 257/666 |
| 7,640,806 B2 * | 1/2010 | Umemura | ............. | G01R 27/2605 73/514.32 |
| 7,644,623 B2 * | 1/2010 | Yokura | ............. | G01K 5/52 73/726 |
| 7,791,180 B2 * | 9/2010 | Shirasaka | ............. | H01L 23/49575 257/674 |
| 7,795,881 B2 * | 9/2010 | Masuda | ............. | G01P 15/125 324/661 |
| 2017/0010298 A1 * | 1/2017 | Tanaka | ............. | G01P 15/125 |
| 2019/0383610 A1 * | 12/2019 | Torimoto | ............. | B81C 3/001 |

FOREIGN PATENT DOCUMENTS

| | | | | |
|---|---|---|---|---|
| JP | 2011129612 | * | 6/2011 | ........... H01L 21/301 |
| JP | 2017-020888 A | | 1/2017 | |
| WO | WO-2005019790 A1 | * | 3/2005 | ............. G01P 1/023 |

OTHER PUBLICATIONS

Pavel Ripka and Alois Tipek, Modern Sensors Handbook, iSTE, 2007, Chapter 5, pp. 193-243 (Year: 2007).*

Ibarra-Villegas F.J. et al., Design of capacitive MEMS transverse-comb accelerometers with test hardware, Sociedad Mexicana de Ciencia y Tecnologia de Superficies y Materales, 2013, 9 pgs (Year: 2013).*

* cited by examiner

PHYSICAL QUANTITY SENSOR, COMPOSITE SENSOR, INERTIAL MEASUREMENT UNIT, VEHICLE POSITIONING DEVICE, PORTABLE ELECTRONIC DEVICE, ELECTRONIC DEVICE, VEHICLE, TRAVELING SUPPORTING SYSTEM, AND DISPLAY DEVICE

The present application is based on, and claims priority from, JP Application Serial Number 2018-112872, filed Jun. 13, 2018, the disclosure of which is hereby incorporated by reference herein in its entirety.

BACKGROUND

1. Technical Field

The present disclosure relates to a physical quantity sensor, a composite sensor, an inertial measurement unit, a vehicle positioning device, a portable electronic device, an electronic device, a vehicle, a traveling supporting system, and a display device.

2. Related Art

As described in JP-A-2017-20888 (Patent Literature 1), as a physical quantity sensor that detects physical quantities such as acceleration and angular velocity, there has been known a physical quantity sensor including a physical quantity sensor element including a fixed electrode and a movable electrode provided side by side with the fixed electrode with a gap therebetween and displaceable in a fixed direction.

In such a physical quantity sensor element, the gap between the fixed electrode and the movable electrode changes according to displacement of the movable electrode. The physical quantity sensor element detects a change in capacitance caused between the fixed electrode and the movable electrode according to the change in the gap to detect changes in the physical quantities such as the acceleration and the angular velocity.

Patent Literature 1 discloses the physical quantity sensor having a structure in which an IC chip (a circuit element) that converts an output signal output from the physical quantity sensor element into a predetermined signal and outputs the predetermined signal is fixed, by an adhesive material, on the physical quantity sensor element fixed on a substrate.

However, in the physical quantity sensor described in Patent Literature 1, when the IC chip is fixed on the physical quantity sensor element by the adhesive material, in some case, the adhesive material flows out from an upper part of the physical quantity sensor element to the substrate in a lower part and is held up in a state in which the adhesive material is in contact with an adhesive material that fixes the physical quantity sensor element to the substrate.

SUMMARY

A physical quantity sensor according to an aspect of the present disclosure includes: a physical quantity sensor element including a substrate, a lid joined to the substrate to form a housing space in an inside, and a physical quantity sensor element piece housed in the housing space and capable of detecting a physical quantity; and a circuit element bonded to a surface of the lid via an adhesive material, the surface being a surface on an opposite side of a side of the physical quantity sensor element piece. A recess is provided along an outer edge of the lid in an outer edge region of the surface on the opposite side of the lid.

In the physical quantity sensor, the recess may be a step section.

In the physical quantity sensor, the recess may be a bottomed hole.

In the physical quantity sensor, width of the bottomed hole may decrease from a surface side on the circuit element side of the lid toward the substrate side.

In the physical quantity sensor, a wall surface of the bottomed wall may be an inclined surface.

In the physical quantity sensor, the lid may have a square shape, and the recess may be provided at least at a pair of sides of the lid.

In the physical quantity sensor, the physical quantity may be acceleration.

A composite sensor according to an aspect of the present disclosure includes: the physical quantity sensor described above; and an angular velocity sensor.

An inertial measurement unit according to an aspect of the present disclosure includes: the physical quantity sensor described above; an angular velocity sensor; and a control section configured to control the physical quantity sensor and the angular velocity sensor.

A vehicle positioning device according to an aspect of the present disclosure includes: the inertial measurement unit described above; a receiving section configured to receive a satellite signal superimposed with position information from a positioning satellite; an acquiring section configured to acquire, based on the received satellite signal, position information of the receiving section; a computing section configured to compute, based on inertia data output from the inertial measurement unit, a posture of a vehicle; and a calculating section configured to calculate a position of the vehicle by correcting the position information based on the calculated posture.

A portable electronic device according to an aspect of the present disclosure includes: the physical quantity sensor described above; a case in which the physical quantity sensor is housed; a processing section housed in the case and configured to process a detection signal output from the physical quantity sensor; a display section housed in the case; and a light-transmissive cover closing an opening section of the case.

The portable electronic device may include a satellite positioning system and measure a moving distance and a moving track of a user.

An electronic device according to an aspect of the present disclosure includes: the physical quantity sensor described above; and a control section configured to perform control based on a detection signal output from the physical quantity sensor.

A vehicle according to an aspect of the present disclosure includes: the physical quantity sensor described above; and a control section configured to perform control based on a detection signal output from the physical quantity sensor.

The vehicle described above may include at least one system of an engine system, a brake system, and a keyless entry system, and the control section may control the system based on the detection signal.

A traveling supporting system according to an aspect of the present disclosure includes: the physical quantity sensor described above; and a control section configured to control at least one of acceleration, braking, and steering based on a detection signal output from the physical quantity sensor.

Implementation and non-implementation of automatic driving is switched according to a change of the detection signal output from the physical quantity sensor.

A display device according to an aspect of the present disclosure includes: a display section worn on a head of a user and configured to irradiate image light on eyes of the user; and the physical quantity sensor described above. The physical quantity sensor includes: a first sensor unit located further on one side than a center of the head in a worn state; and a second sensor unit located further on another side than the center of the head.

DESCRIPTION OF EXEMPLARY EMBODIMENTS

Embodiments embodying the present disclosure are explained below with reference to the drawings. The embodiments explained below do not unduly limit the content of the present disclosure described in the appended claims. Not all of components explained in the embodiments are essential constituent elements of the present disclosure. In the figures, for convenience of explanation, a part of the components is sometimes omitted. In the figures, dimensional ratios of the components are different from actual dimensional ratios to clearly show the components. In the following explanation, for convenience of explanation, in the figures, an X axis, a Y axis, and a Z axis are illustrated as three axes orthogonal to one another. A direction parallel to the X axis is referred to as "X-axis direction", a direction parallel to the Y axis is referred to as "Y-axis direction", and a direction parallel to the Z axis is referred to as "Z-axis direction". A +Z-axis side, which is a direction of an arrow of the Z axis, is referred to as "upper" or "upward". A −Z-axis side is referred to as "lower" or "downward". Concerning the X axis and the Y axis as well, a direction of an arrow is set as a "+" direction.

First Embodiment

Physical Quantity Sensor

First, an acceleration sensor 100 functioning as a physical quantity sensor including an acceleration sensor element 1 functioning as an example of a physical quantity sensor element is explained with reference to FIG. 1.

Figure 1:
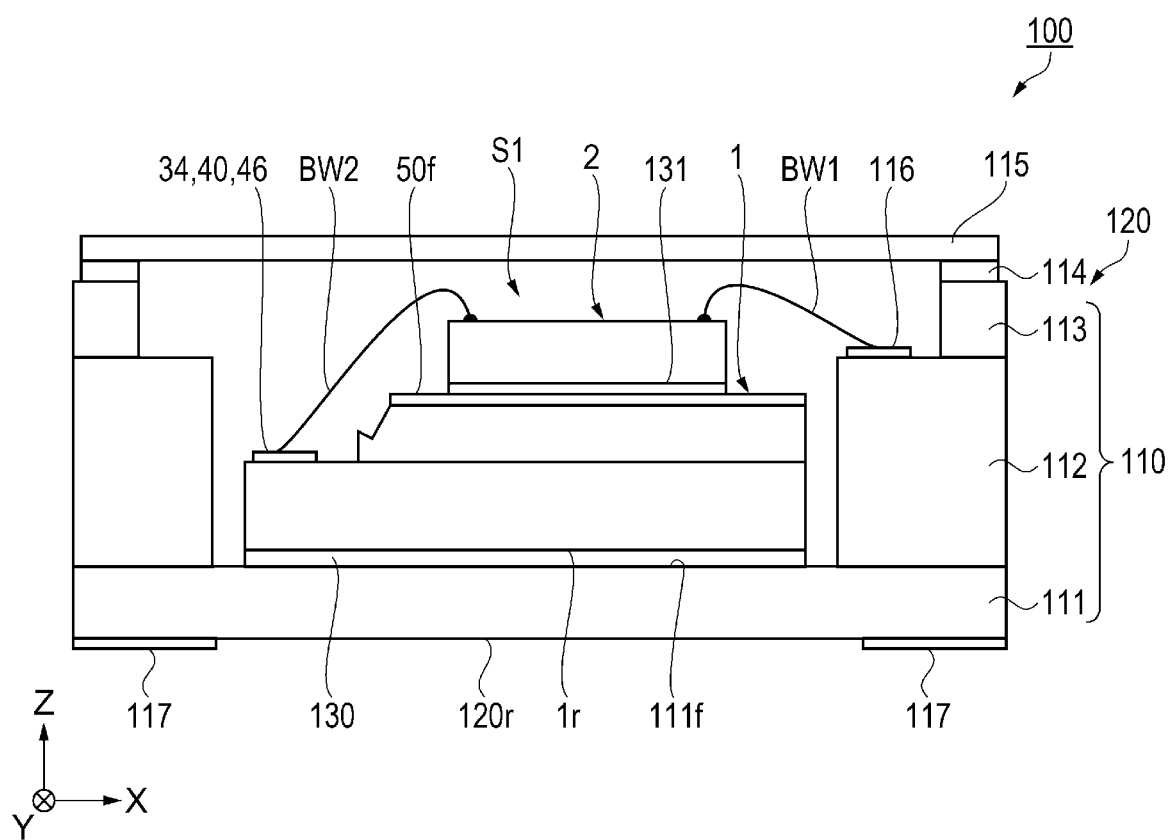
FIG. 1 is a side view schematically showing a schematic configuration of a physical quantity sensor according to a first embodiment of the present disclosure.

FIG. 1 is a side view schematically showing a schematic configuration of a physical quantity sensor according to a first embodiment of the present disclosure.

The acceleration sensor 100 functioning as the physical quantity sensor includes, as shown in FIG. 1, the acceleration sensor element 1 functioning as an example of the physical quantity sensor element. The acceleration sensor 100 is usable as a one-axis acceleration sensor that can independently detect acceleration in one direction. Such an acceleration sensor 100 includes a package 120, the acceleration sensor element 1 housed in the package 120, and a circuit element 2 bonded on the acceleration sensor element 1. A lower surface 1r of the acceleration sensor element 1 is attached to the inner side (a housing space S1) of the package 120, that is, on an upper surface 111f of a first base material 111 by an adhesive material 130.

The package 120 includes a base section 110 configured by the first base material 111, a second base material 112, and a third base material 113 and a lid 115 joined to the third base material 113 via a sealing member 114. The first base material 111, the second base material 112, and the third base material 113 are stacked in this order to configure the base section 110. The first base material 111 has a flat shape. The second base material 112 and the third base material 113 are annular bodies, the centers of which are removed. The sealing member 114 such as a seal ring or low-melting point glass is formed at the peripheral edge of the upper surface of the third base material 113.

In the package 120, a recess (a cavity) that houses the acceleration sensor element 1 and the circuit element 2 is formed by the second base material 112 and the third base material 113, which are the annular bodies, the centers of which are removed. An opening of the recess (the cavity) of the package 120 is closed by the lid 115, whereby the housing space (an inner space) S1, which is a sealed space, is provided. The acceleration sensor element 1 and the circuit element 2 can be housed in the housing space S1. In this way, the acceleration sensor element 1 and the circuit element 2 are housed in the housing space S1 provided between the base section 110 and the lid 115. Consequently, the acceleration sensor 100 can be made compact. Illustration of a part of wiring patterns and electrode pads (terminal electrodes) formed in the base section 110 including the first base material 111 and the second base material 112 is omitted.

Ceramic or the like is suitably used as a constituent material of the first base material 111, the second base material 112, and the third base material 113. As the constituent material of the first base material 111, the second base material 112, and the third base material 113, glass, metal, and the like may be used other than ceramic. As a constituent material of the lid 115, for example, a metal material such as Kovar, a glass material, a silicon material, and a ceramic material can be used.

A plurality of internal terminals 116 are disposed on the upper surface of the second base material 112. A plurality of external terminals 117 are disposed on an outer bottom surface 120r of the package 120, which is the lower surface of the first base material 111. The internal terminals 116 are electrically coupled to the external terminals 117 corresponding to the internal terminals 116 via not-shown inner wires or the like formed in the base section 110. The internal terminals 116 and the external terminals 117 can be formed by, for example, a method of screen-printing a metal wiring material such as tungsten (W) or molybdenum (Mo) in a predetermined position and baking the metal wiring material and applying plating of nickel (Ni), gold (Au), or the like on the metal wiring material.

The lower surface 1r of the acceleration sensor element 1 is bonded to the upper surface 111f of the first base material 111 configuring the base section 110 by the adhesive material 130. The acceleration sensor element 1 is housed in the housing space S1 of the package 120. The housing space S1 of the package 120 is hermetically sealed in a decompressed atmosphere having pressure lower than the atmospheric pressure or an inert gas atmosphere such as nitrogen, argon, or helium.

The circuit element 2 is bonded to an upper surface 50f of the acceleration sensor element 1 via an adhesive material 131. The circuit element 2 includes, for example, a driving circuit that drives the acceleration sensor element 1, a detection circuit that detects acceleration based on a signal from the acceleration sensor element 1, and an output circuit that converts a signal from the detection circuit into a predetermined signal and outputs the predetermined signal. The circuit element 2 includes a plurality of electrode pads (not shown in FIG. 1) on the upper surface of the circuit element 2. The electrode pads are electrically coupled to the internal terminals 116 provided on the upper surface of the second base material 112 via a bonding wire BW1. The other electrode pads are electrically coupled to a first terminal electrode 34, a second terminal electrode 40, and a third terminal electrode 46 provided in the acceleration sensor element 1 via a bonding wire BW2. Consequently, the acceleration sensor element 1 can be controlled.

Physical Quantity Sensor Element

The acceleration sensor element 1 functioning as an example of the physical quantity sensor element is explained with reference to FIGS. 2, 3, 4, and 5.

Figure 2:
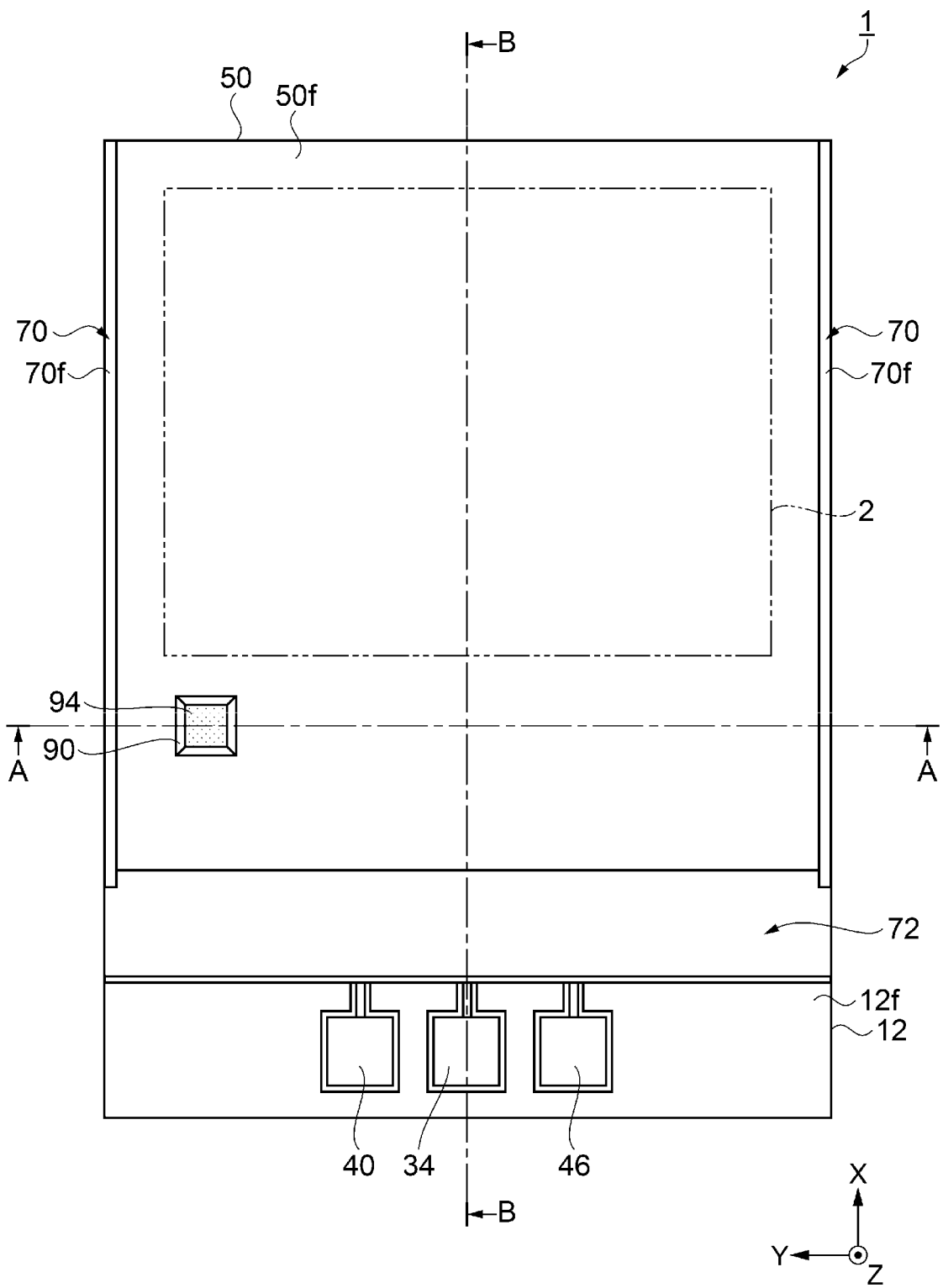
FIG. 2 is a plan view schematically showing a schematic configuration of a physical quantity sensor element included in the physical quantity sensor shown in FIG. 1.
Figure 3:
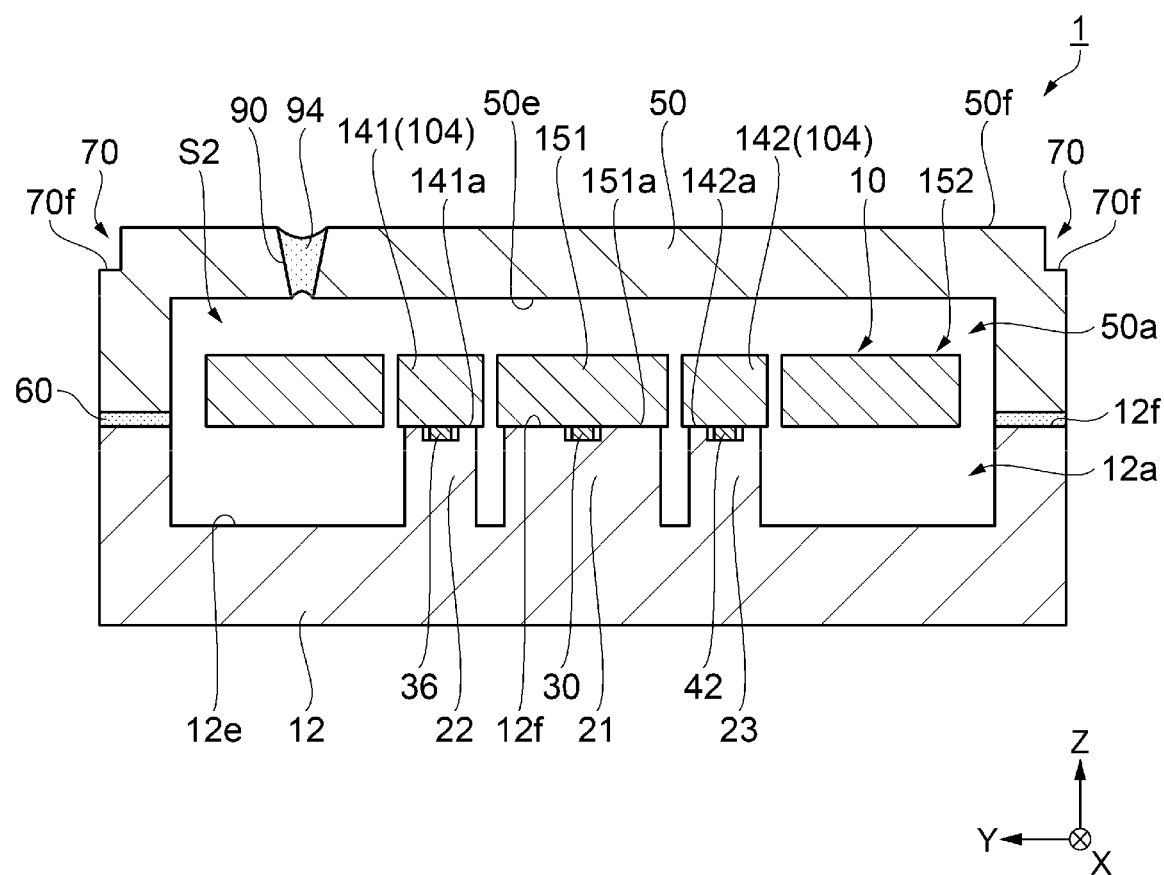
FIG. 3 is an A-A line sectional view in FIGS. 2 and 5.
Figure 4:
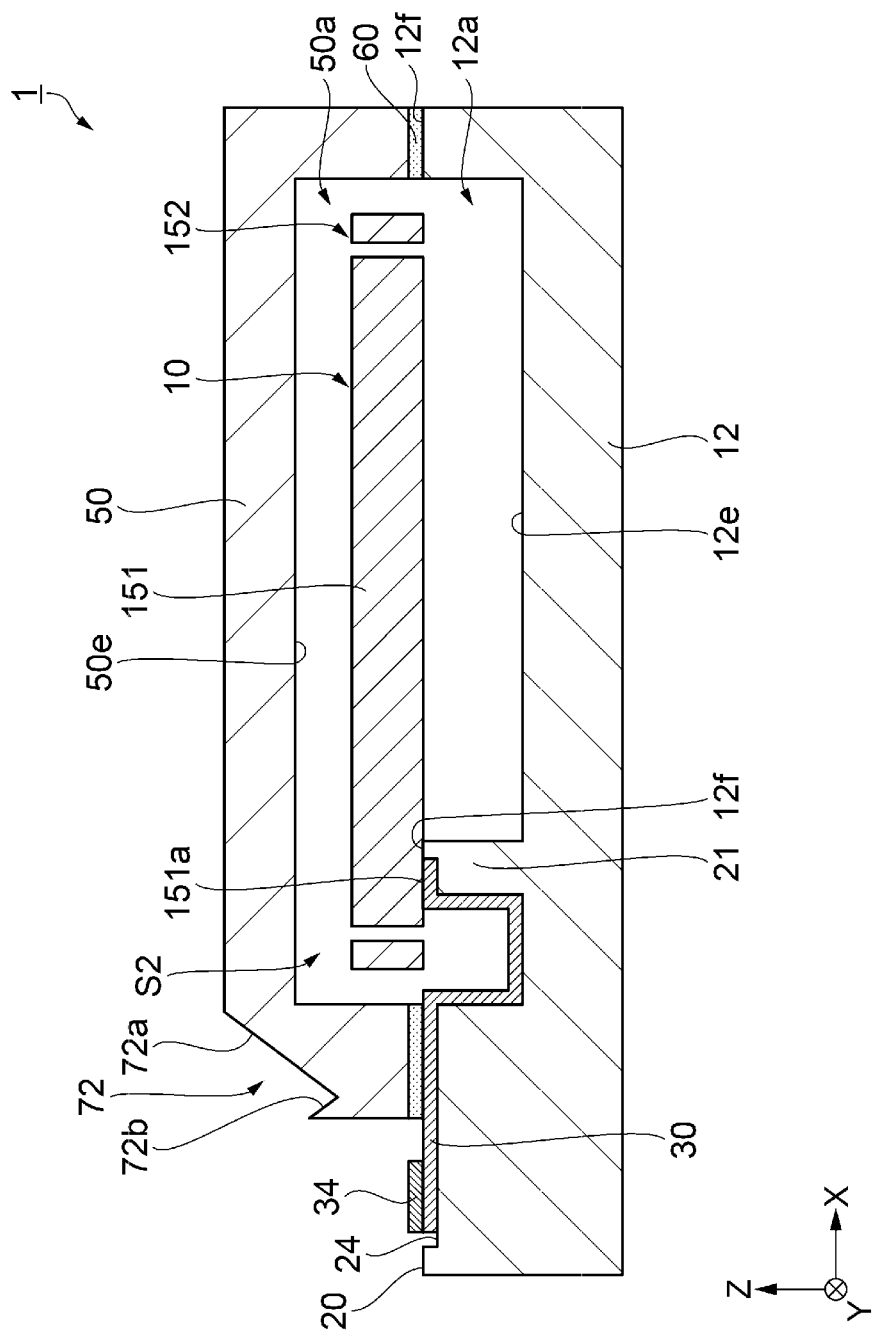
FIG. 4 is a B-B line sectional view in FIG. 2.
Figure 5:
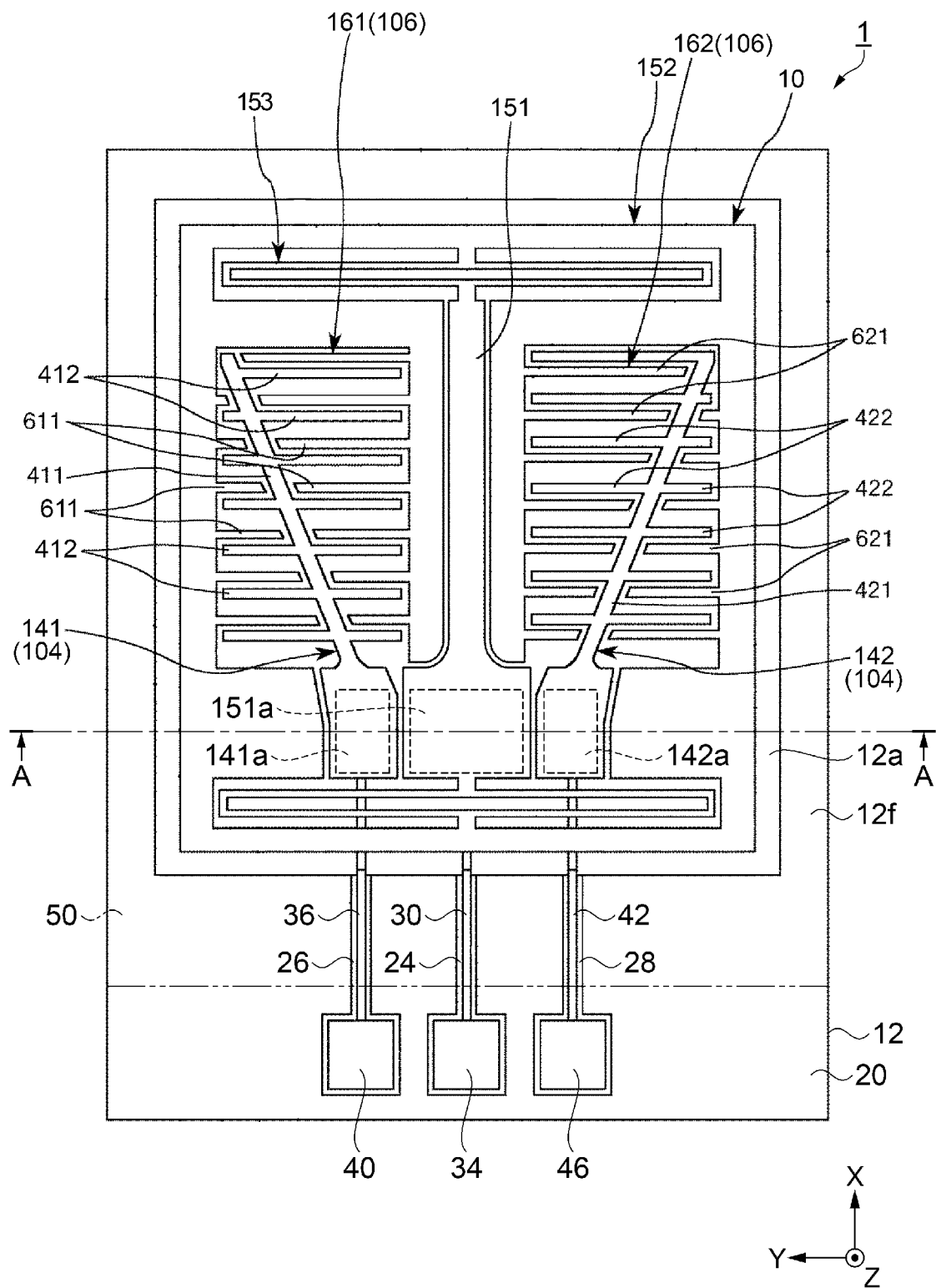
FIG. 5 is a plan view schematically showing a schematic configuration of a physical quantity sensor element piece included in the physical quantity sensor element shown in FIG. 2.

FIG. 2 is a plan view schematically showing a schematic configuration of the physical quantity sensor element included in the physical quantity sensor shown in FIG. 1. FIG. 3 is an A-A line sectional view (a sectional view viewed from the X-axis direction) in FIGS. 2 and 5. FIG. 4 is a B-B line sectional view (a sectional view viewed from the Y-axis direction) in FIG. 2. FIG. 5 is a plan view (a plan view viewed from the Z-axis direction) schematically showing a schematic configuration of a physical quantity sensor element piece included in the physical quantity sensor element shown in FIG. 2. In FIG. 5, for convenience of explanation of the configuration of the inside of the acceleration sensor element 1, a state in which a lid 50 is removed is shown.

The acceleration sensor element 1 includes, as shown in FIGS. 2, 3, 4, and 5, a square substrate 12, a square lid 50 joined to the substrate 12, a recess 50a being provided on a side of the lid 50 opposed to the substrate 12, and an acceleration sensor element piece 10 housed in a housing space S2 formed by the substrate 12 and the lid 50. In the acceleration sensor 100 explained above, the circuit element 2 configured as an IC (Integrated Circuit) is bonded, via the adhesive material 131 (see FIG. 1), to the upper surface 50f, which is the surface of the lid 50 of the acceleration sensor element 1 and is the surface on the opposite side of the acceleration sensor element piece 10 side.

The substrate 12 includes a plane orthogonal to the Z axis, that is, a principal plane 12f joined to a plurality of joining sections 141a, 142a, and 151a and the like that support the acceleration sensor element piece 10. A terminal section 20 is provided at an end portion in a − (minus) X-axis direction of the principal plane 12f. A region other than the terminal section 20 is covered by the lid 50 including the recess 50a on the principal plane 12f side. A recess 12a, a planar shape of which is a substantially rectangular shape, is provided in substantially the center of the principal plane 12f in order to avoid interference between a movable section 152 and the substrate 12. Consequently, a movable region (a displacement region) of the movable section 152 is fit in the recess 12a in a plan view.

A first groove section 24 extending along the X axis toward the recess 12a is provided in the center in the Y-axis direction on the terminal section 20 side of the principal plane 12f. A second groove section 26 is provided along the outer periphery of the first groove section 24 on one side in the Y-axis direction of the first groove section 24 on the terminal section 20 side of the principal plane 12f. Further, a third groove section 28 is provided on the opposite side of the second groove section 26 across the first groove section 24 on the terminal section 20 side of the principal plane 12f.

A first wire 30 is provided on the bottom surface of the first groove section 24 along the first groove section 24. The first wire 30 is a wire electrically coupled to first movable electrode fingers 611 and second movable electrode fingers 621 provided in a movable electrode section 106 of the movable section 152 via a fixed section 151 explained below. A second wire 36 is provided on the bottom surface of the second groove section 26 along the second groove section 26. The second wire 36 is a wire electrically coupled to first fixed electrode fingers 412 provided in a fixed electrode section 104. A third wire 42 is provided on the bottom surface of the third groove section 28 along the third groove section 28. The third wire 42 is a wire electrically coupled to second fixed electrode fingers 422 provided in the fixed electrode section 104. End portions (end portions disposed in the terminal section 20) of the first wire 30, the second wire 36, and the third wire 42 are respectively the first terminal electrode 34, the second terminal electrode 40, and the third terminal electrode 46.

The first wire 30 is disposed in, from the bottom surface of the first groove section 24, via a bottom surface 12e of the recess 12a provided in the substrate 12, a mount section 21 provided in order to fixed the fixed section 151 of the acceleration sensor element piece 10. The first wire 30 is joined to the joining section 151a of the acceleration sensor element piece 10 in the mount section 21 to be electrically coupled to the movable electrode section 106. The second wire 36 is disposed in, from the bottom surface of the second groove section 26, via the bottom surface 12e of the recess 12a provided in the substrate 12, a mount section 22 provided to fix a first fixed electrode section 141 (the fixed electrode section 104) of the acceleration sensor element piece 10. The second wire 36 is joined to the joining section 141a of the acceleration sensor element piece 10 in the mount section 22 to be electrically coupled to the first fixed electrode section 141 (the fixed electrode section 104). The third wire 42 is disposed in, from the bottom surface of the third groove section 28, via the bottom surface 12e of the recess 12a provided in the substrate 12, a mount section 23 provided to fix a second fixed electrode section 142 (the fixed electrode section 104) of the acceleration sensor element piece 10. The third wire 42 is joined to the joining section 142a of the acceleration sensor element piece 10 in the mount section 23 to be electrically coupled to the second fixed electrode section 142 (the fixed electrode section 104).

As a constituent material of the substrate 12, an insulating material such as glass or high-resistance silicon is desirably used. In particular, when a semiconductor substrate forming the fixed electrode section 104, the movable electrode section 106, the fixed section 151, and the movable section 152 is configured using a semiconductor material such as silicon as a main material, as the constituent material of the substrate 12, glass including alkali metal ion (movable ion) (e.g., borosilicate glass such as Pyrex (registered trademark)) is desirably used. Consequently, in the acceleration sensor element 1, the substrate 12 and the semiconductor substrate can be formed by being anodically bonded. In the acceleration sensor element 1, by using glass including alkali metal ion as the substrate 12, the substrate 12 and the semiconductor substrate can be easily insulated and separated.

The substrate 12 does not always have insulation. For example, a conductive substrate made of low-resistance silicon may be provided. In this case, the substrate 12 and the semiconductor substrate are insulated and separated from each other via an insulating film. A constituent material of the substrate 12 desirably has as small a thermal expansion coefficient difference as possible from a constituent material of the semiconductor substrate. Specifically, the thermal expansion coefficient difference between the constituent material of the substrate 12 and the constituent material of the semiconductor substrate is desirably 3 ppm/° C. or less. Consequently, the acceleration sensor element 1 can reduce residual stress between the substrate 12 and the semiconductor substrate. In this embodiment, it is assumed that glass is used as a main material of the substrate 12.

Constituent materials of the first wire 30, the second wire 36, and the third wire 42 are not particularly limited if the constituent materials respectively have electric conductivity. Various electrode materials can be used. Examples of the constituent materials include oxides (transparent electrode materials) such as ITO (Indium Tin Oxide), IZO (Indium Zinc Oxide), $In_2O_3$, $SnO_2$, Sb-containing $SnO_2$, and Al-containing ZnO, Au, Pt, Ag, Cu, and Al, and alloys containing Au, Pt, Ag, Cu, and Al. One of these materials can be used or two or more of these materials can be used in combination.

In the acceleration sensor element 1, if the constituent materials of the wires are a transparent electrode material (in particular, ITO) and the substrate 12 is transparent, foreign matters or the like present on the surfaces of the first fixed electrode fingers 412 and the second fixed electrode fingers 422 can be easily visually recognized from a surface on the opposite side of the principal plane 12f side of the substrate 12. An inspection can be efficiently performed.

The acceleration sensor element piece 10 includes, as shown in FIG. 5, the fixed electrode section 104 including the first fixed electrode fingers 412 and the second fixed electrode fingers 422 attached to the substrate 12, the movable section 152 displaceable in the X-axis direction (a direction of a detection axis of a physical quantity) with respect to the substrate 12 via a spring section 153, the movable electrode section 106 including the first movable electrode fingers 611 and the second movable electrode fingers 621 provided in the movable section 152, and the fixed section 151 that fixes the spring section 153 to the substrate 12. The acceleration sensor element piece 10 has a function of detecting acceleration Ax (a physical quantity) in the X-axis direction. In the joining sections 141a and 142a of the fixed electrode section 104 and the joining section 151a of the fixed section 151, the acceleration sensor element piece 10 is joined to the principal plane 12f of the mount sections 21, 22, and 23 and the wires (the first wire 30, the second wire 36, and the third wire 42) provided on the substrate 12. Therefore, the acceleration sensor element piece 10 is housed in the housing space S2 by being joined to the mount sections 21, 22, and 23 provided in the substrate 12.

The fixed electrode section 104 includes the first fixed electrode section 141 and the second fixed electrode section 142 disposed side by side along the Y-axis direction (a direction crossing (in this embodiment, orthogonal to) the detection axis). The first fixed electrode section 141 includes a first trunk section 411 and a plurality of first fixed electrode fingers 412 provided on both sides in the Y-axis direction of the first trunk section 411. A longitudinal direction of the plurality of first fixed electrode fingers 412 extends along the Y-axis direction. The second fixed electrode section 142 includes a second trunk section 421 and a plurality of second fixed electrode fingers 422 provided on both sides in the Y-axis direction from the second trunk section 421. A longitudinal direction of the plurality of second fixed electrode fingers 422 extends along the Y-axis direction.

The movable electrode section 106 includes a first movable electrode section 161 and a second movable electrode section 162 disposed side by side along the Y-axis direction. At least a part of the first movable electrode section 161 includes a plurality of first movable electrode fingers 611 located on both sides in the Y-axis direction of the first trunk section 411. A longitudinal direction of the plurality of first movable electrode fingers 611 extends along the Y-axis direction. The plurality of first movable electrode fingers 611 are opposed to the first fixed electrode fingers 412 in the X-axis direction. At least a part of the second movable electrode section 162 includes a plurality of second movable electrode fingers 621 located on both sides in the Y-axis direction of the second trunk section 421. A longitudinal direction of the plurality of second movable electrode fingers 621 extends along the Y-axis direction. The plurality of second movable electrode fingers 621 are opposed to the second fixed electrode fingers 422 in the X-axis direction.

In the acceleration sensor element piece 10, capacitors are formed between the first fixed electrode fingers 412 and the first movable electrode fingers 611 opposed to the first fixed electrode fingers 412 in the X-axis direction and between the second fixed electrode fingers 422 and the second movable electrode fingers 621 opposed to the second fixed electrode fingers 422 in the X-axis direction. In this state, for example, when acceleration along the X-axis direction is applied to the acceleration sensor element piece 10, the first movable electrode fingers 611 of the first movable electrode section 161 and the second movable electrode fingers 621 of the second movable electrode section 162 are displaced in the X-axis direction by inertia. The acceleration sensor element piece 10 can detect the acceleration Ax in the X-axis direction by detecting a change in the capacitance of the capacitors caused by the displacement.

In the acceleration sensor element piece 10, by adopting such a configuration, it is possible to reduce the lengths of the first fixed electrode fingers 412 and the second fixed electrode fingers 422 and the first movable electrode fingers 611 and the second movable electrode fingers 621 while keeping sufficiently large capacitance between the first movable electrode fingers 611 and the first fixed electrode fingers 412 and sufficiently large capacitance between the second movable electrode fingers 621 and the second fixed electrode fingers 422. Therefore, in the acceleration sensor element piece 10, the first fixed electrode fingers 412, the second fixed electrode fingers 422, the first movable electrode fingers 611, and the second movable electrode fingers 621 are less easily broken and have excellent shock resistance.

Although not shown in FIG. 5, by disposing the substrate 12 and the acceleration sensor element piece 10 provided in the substrate 12 in a direction in which the substrate 12 and the acceleration sensor element piece 10 provided in the substrate 12 are disposed side by side along the Y-axis direction, the acceleration sensor element 1 capable of detecting the acceleration Ax in the X-axis direction shown in FIG. 5 and explained can be configured as an acceleration sensor element capable of detecting acceleration Ay in the Y-axis direction.

The acceleration sensor element piece 10 is formed by photolithography and etching from a not-shown semiconductor substrate (silicon substrate) joined on the substrate 12.

As shown in FIGS. 2, 3, and 4, the lid 50 has a square shape as a planar shape. The recess 50a that houses the acceleration sensor element piece 10 is provided on a side of the lid 50 opposed to the substrate 12. The lid 50 is joined to the principal plane 12f of the substrate 12 by a joining member 60. Recesses 70 and 72 are provided in an outer edge region of the upper surface 50f, which is the surface on the opposite side of the acceleration sensor element piece 10 side, along the outer edge of the lid 50. Therefore, when the circuit element 2 is bonded to the upper surface 50f of the lid 50 (the acceleration sensor element 1), even if an excess adhesive material 131 flows out along the upper surface 50f of the lid 50, the flowing-out adhesive material 131 can be held up in the recesses 70 and 72 provided along the outer edge of the upper surface 50f. Therefore, it is possible to prevent the excess adhesive material 131 from flowing on the side surface of the lid 50 from the upper surface 50f to be held up in a state in which the excess adhesive material 131 is in contact with the adhesive material 130 that attaches the acceleration sensor element 1 to the package 120. Accordingly, it is possible to prevent stress and distortion that occur because of hardening of the adhesive material 131 from being transmitted to the acceleration sensor element 1 via the adhesive material 130 that attaches the acceleration sensor element 1. Since the influence of the stress and the distortion on the acceleration sensor element 1 can be reduced, for example, it is possible to prevent a bias output signal output from the acceleration sensor element 1 from fluctuating.

In FIG. 3, in this embodiment, the recesses 70 are recessed from the upper surface 50f toward the substrate 12 side and formed as step sections. That is, the recesses 70 include surfaces 70f lower than the upper surface 50f (the surfaces 70f where the thickness of the lid 50 is smaller than the height of the upper surface 50f). Therefore, when the excess adhesive material 131 flows out along the side surfaces of the recesses 70 from the upper surface 50f of the lid 50, since the recesses 70 are formed by, for example, dicing as explained below, the excess adhesive material 131 spreads to the entire regions of the side surfaces and the surfaces 70f of the recesses 70 with capillary phenomenon. The excess adhesive material 131 can be held up in the recesses 70.

The recesses 70 are provided on a pair of sides extending along a direction (the X-axis direction) in which the wires (the first wire 30, the second wire 36, and the third wire 42) extend on the upper surface 50f of the lid 50. The recesses 70 are disposed to be opposed to each other across the circuit element 2. Therefore, even if the adhesive material 131 flows out to both sides of the circuit element 2, the excess adhesive material 131 can be held up in the recesses 70.

On the other hand, in FIG. 4, the recess 72 including inclined surfaces 72a and 72b is provided on a side extending along a direction (the Y-axis direction) crossing the opposed pair of sides on which the recesses 70 are provided. The inclined surface 72a is a surface formed such that the thickness of the lid 50 decreases toward the substrate 12 side from the upper surface 50f of the lid 50. Therefore, it is possible to prevent the bonding wire BW2, which electrically couples the plurality of electrode pads (not shown in FIG. 4) included in the circuit element 2 bonded to the upper surface 50f of the lid 50 (the acceleration sensor element 1) and the first terminal electrode 34, the second terminal electrode 40, and the third terminal electrode 46 of the acceleration sensor element 1, from being broken at a corner portion of the lid 50. In contrast to the inclined surface 72a, the inclined surface 72b is a surface formed such that the thickness of the lid 50 increases from the bottom of the recess 72 toward the upper surface 50f of the lid 50. Therefore, when the circuit element 2 is bonded to the upper surface 50f of the lid 50 (the acceleration sensor element 1) by the inclined surface 72b, it is possible to prevent the adhesive material 131 from flowing along the inclined surface 72a to be held up on the principal plane 12f of the substrate 12.

In this embodiment, the recesses 70 including the step sections are provided on the pair of sides extending along the X-axis direction. The recess 72 including the inclined surfaces 72a and 72b is provided on the side extending along the Y-axis direction. However, the recesses 70 and 72 are not limited to this. The recesses 70 including the step sections may be provided on a side or a pair of sides extending along the Y-axis direction. The recess 72 including the inclined surfaces 72a and 72b may be provided on a side or a pair of sides extending along the X-axis direction. The recesses 70 including the step sections or the recess 72 including the inclined surfaces 72a and 72b may be respectively provided along the four sides of the lid 50.

As a forming method for the recesses 70 including the step sections, for example, after the lid 50 and the substrate 12 are joined, the upper surface 50f of the lid 50 is half-diced at tooth thickness larger than tooth thickness of dicing for singulating the lid 50 and the substrate 12 into the acceleration sensor element 1. Thereafter, the recesses 70 can be formed by full-dicing a half-diced region at tooth thickness smaller than the tooth thickness used for the half-dicing.

As a forming method for the recess 72 including the inclined surfaces 72a and 72b, first, the lid 50 including the inclined surfaces 72a and 72b on the upper surface 50f of the lid 50 and including a recess opened to the opposite side of the upper surface 50f in a region equivalent to the terminal section 20 of the substrate 12 on the surface on the opposite side of the upper surface 50f is prepared. After the lid 50 and the substrate 12 are joined, the region equivalent to the terminal section 20 of the substrate 12 of the lid 50 and a part of the inclined surface 72b are diced and removed. Thereafter, the recess 72 can be formed by singulating the lid 50 and the substrate 12 into the acceleration sensor element 1 by dicing.

The lid 50 includes, as shown in FIGS. 2 and 3, the hole 90 piercing through the lid 50 from the recess 50a (a ceiling surface 50e, which is the inner surface on the housing space S2 side) to the upper surface 50f, which is the surface on the opposite side of the housing space S2 side.

The planar shape of the hole 90 is formed in a substantially rectangular shape. The hole 90 is sealed by a sealing member 94. In detail, the lid 50 is hermetically joined (fixed) to the principal plane 12f of the substrate 12 using, for example, a joining method by an adhesive, an anodic bonding method, or a direct bonding method. Thereafter, the sealing member 94 is placed on the hole 90. Thereafter, a laser beam, an electron beam, or the like is irradiated on the sealing member 94. The hole 90 is sealed (closed) by the melted sealing member 94.

The lid 50 is joined to the substrate 12 by the joining member 60. The housing space S2 including the recess 12a of the substrate 12 and the recess 50a of the lid 50 is filled with an inert gas such as nitrogen, helium, or argon and is in a state close to the atmospheric pressure or a decompressed state (a state with a high vacuum degree) by the sealing of the hole 90.

A constituent material of the sealing member 94 is not particularly limited. An Au—Ge alloy, an Au—Sn alloy, an Sn—Pb alloy, a Pb—Ag alloy, and the like can be suitably used.

Circuit Element

The circuit element 2 is explained.

The circuit element 2 is bonded to the upper surface 50f of the acceleration sensor element 1 via the adhesive material 131. The adhesive material 131 is not particularly limited if the circuit element 2 can be fixed on the acceleration sensor element 1. For example, solder, silver paste, a resin-based adhesive material (a die attach material), and the like can be used.

The circuit element 2 includes, for example, a driving circuit configured to drive the acceleration sensor element 1, a detection circuit configured to detect the acceleration Ax based on a signal from the acceleration sensor element 1, and an output circuit configured to convert a signal from the detection circuit into a predetermined signal and output the predetermined signal. The circuit element 2 includes a plurality of electrode pads (not shown in FIG. 1) on the upper surface. The electrode pads are electrically coupled to the first terminal electrode 34, the second terminal electrode 40, and the third terminal electrode 46 provided on the substrate 12 of the acceleration sensor element 1 via the bonding wire BW2. Therefore, it is possible to control the acceleration sensor element 1 including the acceleration sensor element piece 10.

In the acceleration sensor 100 functioning as the physical quantity sensor explained above, the recesses 70 and 72 are provided along the outer edge of the lid 50 in the outer edge region of the upper surface 50f, which is the surface on the opposite side of the acceleration sensor element piece 10 side of the lid 50. Therefore, when the circuit element 2 is bonded to the upper surface 50f of the lid 50 (the acceleration sensor element 1), even if the excess adhesive material 131 flows out along the upper surface 50f of the lid 50, the flowing-out adhesive material 131 can be held up in the recesses 70 and 72 provided along the outer edge of the upper surface 50f. Therefore, the excess adhesive material 131 is not held up in a state in which the excess adhesive material 131 flows along the side surface from the upper surface 50f of the lid 50 and is in contact with the adhesive material 130 that fixes the acceleration sensor element 1 to the package 120. Therefore, it is possible to prevent a situation in which distortion during hardening of the held-up adhesive material 131 is transmitted to the acceleration sensor element 1 via the adhesive material 130 that fixes the acceleration sensor element 1 and the bias output signal output from the acceleration sensor element 1 fluctuates.

The recesses 70 are the step sections including the surfaces 70f lower than the upper surface 50f (the surfaces 70f where the thickness of the lid 50 is smaller than the height of the upper surface 50f). Therefore, when the excess adhesive material 131 flows out along the side surfaces of the recesses 70 from the upper surface 50f of the lid 50, since the recesses 70 are formed by dicing or the like, the excess adhesive material 131 spreads to the entire regions of the side surfaces and the surfaces 71 of the recesses 70 with the capillary phenomenon. The excess adhesive material 131 can be held up in the recesses 70. Therefore, it is possible to reduce fluctuation of the bias output signal output from the acceleration sensor element 1.

The lid 50 has the square shape. On the upper surface 50f of the lid 50, the recesses 70 are provided on the pair of sides extending along the direction (the X-axis direction) in which the wires (the first wire 30, the second wire 36, and the third wire 42) extend. Therefore, even if the adhesive material 131 flows out from both the sides of the circuit element 2, the excess adhesive material 131 can be held up in the recesses 70. Therefore, it is possible to reduce fluctuation of the bias output signal output from the acceleration sensor element 1.

Second Embodiment

An acceleration sensor element 1a included in a physical quantity sensor according to a second embodiment of the present disclosure is explained with reference to FIGS. 6 and 7.

Figure 6:
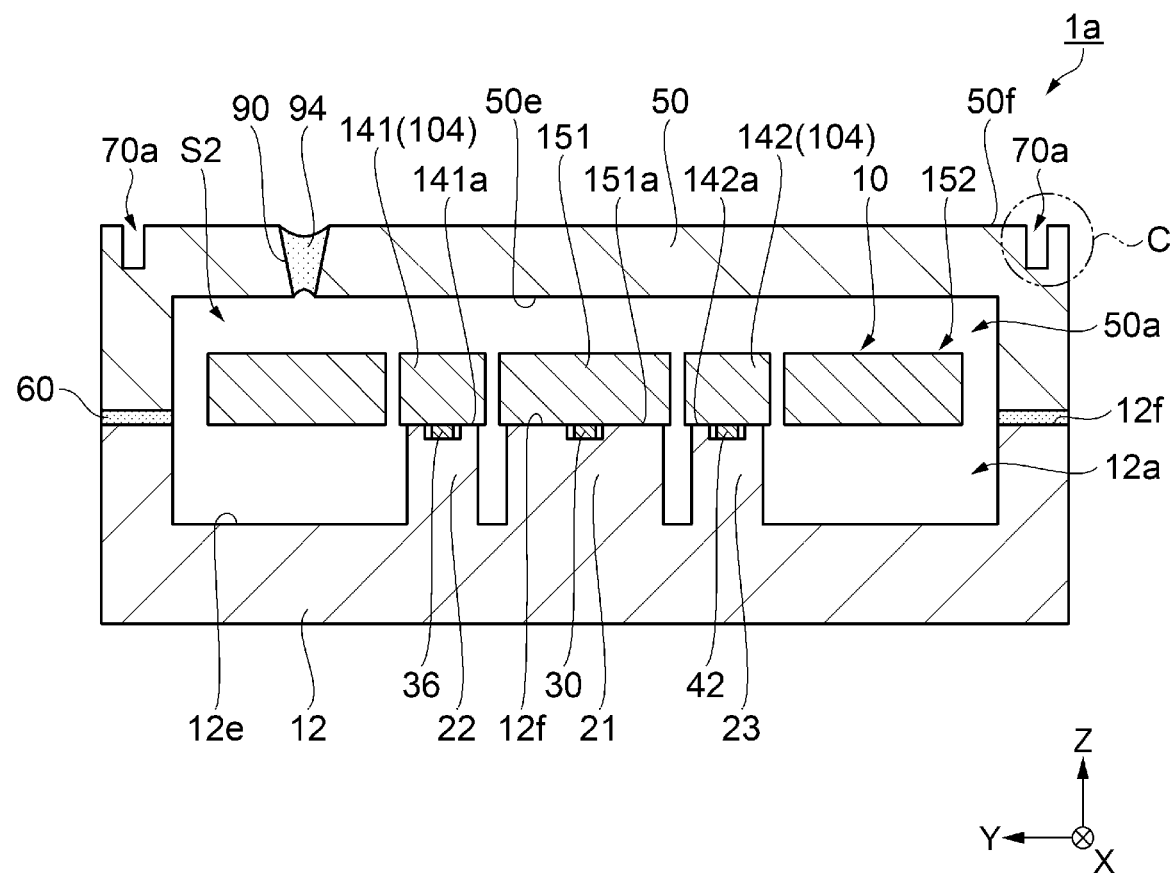
FIG. 6 is a sectional view of a physical quantity sensor element included in a physical quantity sensor according to a second embodiment of the present disclosure.
Figure 7:
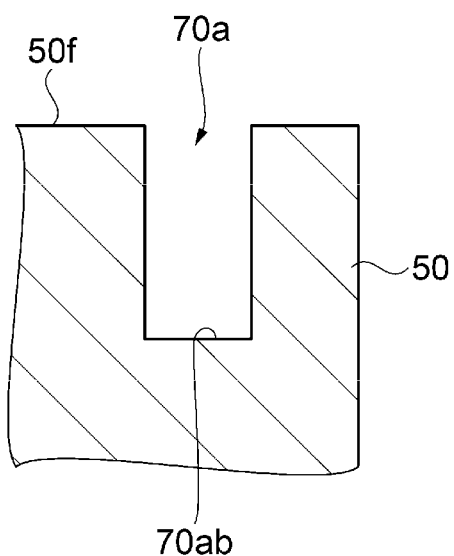
FIG. 7 is an enlarged view of a C part in FIG. 6.

FIG. 6 is a sectional view of a physical quantity sensor element included in the physical quantity sensor according to the second embodiment of the present disclosure. FIG. 7 is an enlarged view of a C part in FIG. 6.

In the acceleration sensor element 1a according to this embodiment, components other than recesses 70a provided on the upper surface 50f are the same as the components of the acceleration sensor element 1 in the first embodiment explained above.

In the following explanation, concerning the acceleration sensor element 1a in the second embodiment, differences from the first embodiment are mainly explained. Explanation concerning similarities to the first embodiment is omitted. In FIGS. 6 and 7, the same components as the components in the first embodiment are denoted by the same reference numerals and signs.

The acceleration sensor element 1a in this embodiment includes the recesses 70a provided along the outer edge (the pair of sides extending along the X-axis direction) of the lid 50. As shown in FIGS. 6 and 7, in a sectional view viewed from the X-axis direction, the recesses 70a provided on the upper surface 50f are bottomed holes including bottom surfaces 70ab.

By adopting such a configuration, when the circuit element 2 is bonded to the lid 50, the excess adhesive material 131 can be held up in the recesses 70a. Therefore, according to the second embodiment, it is possible to exert the same effects as the effects in the first embodiment explained above.

Third Embodiment

An acceleration sensor element 1b included in a physical quantity sensor according to a third embodiment of the present disclosure is explained with reference to FIGS. 8 and 9.

Figure 8:
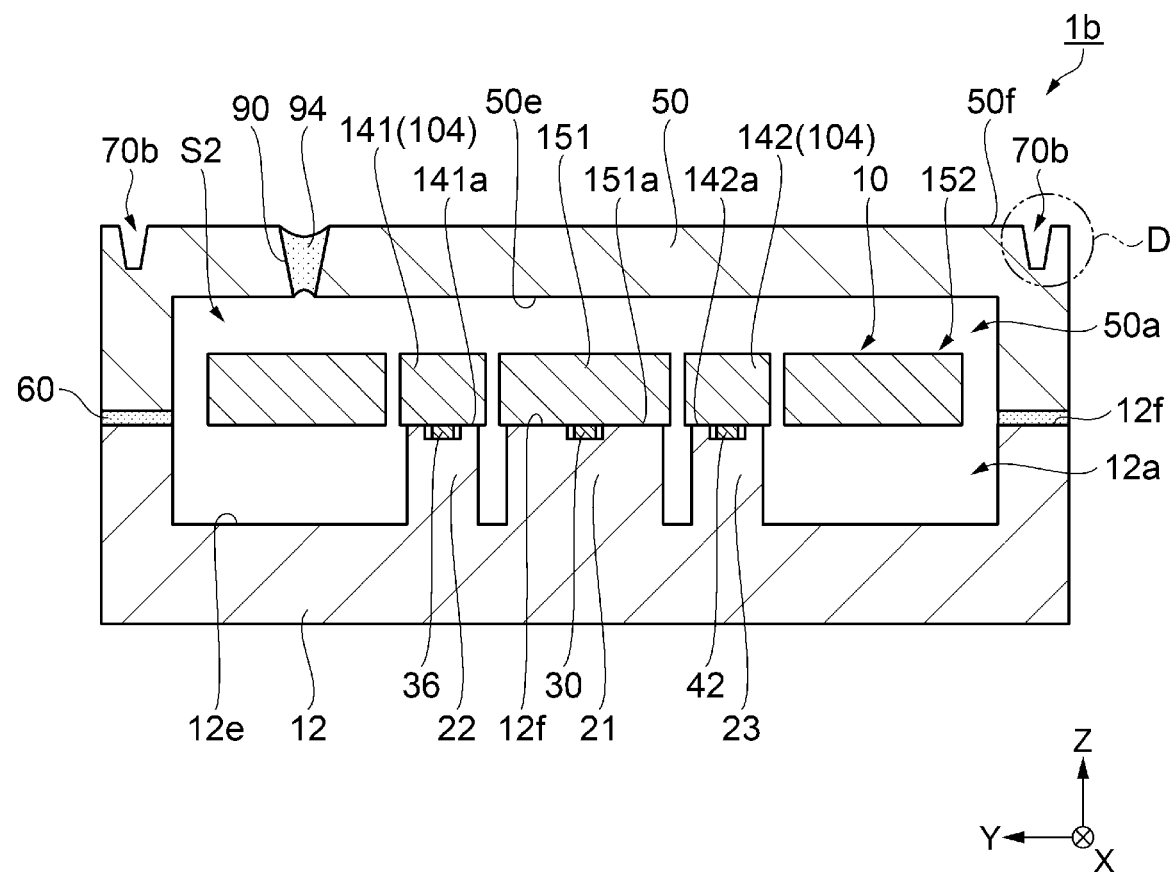
FIG. 8 is a sectional view of a physical quantity sensor element included in a physical quantity sensor according to a third embodiment of the present disclosure.
Figure 9:
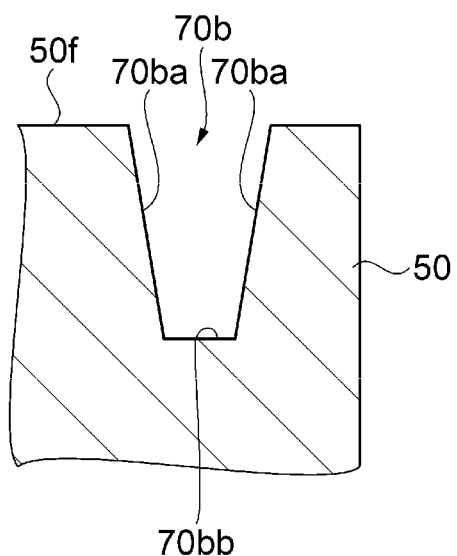
FIG. 9 is an enlarged view of a D part in FIG. 8.

FIG. 8 is a sectional view of a physical quantity sensor element included in the physical quantity sensor according to the third embodiment of the present disclosure. FIG. 9 is an enlarged view of a D part in FIG. 8.

In the acceleration sensor element 1b according to this embodiment, components other than recesses 70b provided on the upper surface 50f are the same as the components of the acceleration sensor element 1 in the first embodiment explained above.

In the following explanation, concerning the acceleration sensor element 1b in the third embodiment, differences from the first embodiment are mainly explained. Explanation concerning similarities to the first embodiment is omitted. In FIGS. 8 and 9, the same components as the components in the first embodiment are denoted by the same reference numerals and signs.

The acceleration sensor element 1b in this embodiment includes the recesses 70b provided along the outer edge (the pair of sides extending along the X-axis direction) of the lid 50. As shown in FIGS. 8 and 9, in a sectional view viewed from the X-axis direction, the recesses 70b provided on the upper surface 50f are bottomed holes including bottom surfaces 70bb. The width of the holes decreases from the upper surface 50f side on the circuit element 2 side of the lid 50 toward the substrate 12 side. That is, the width of regions of the recesses 70b close to the bottom surfaces 70bb is smaller than the width of regions of the recesses 70b close to the upper surface 50f. Wall surfaces of the recesses 70b are configured by inclined surfaces 70ba.

By adopting such a configuration, when the circuit element 2 is bonded to the lid 50, the adhesive material 131 more easily flows into the recesses 70b. The excess adhesive material 131 can be held up in the recesses 70b. Therefore, according to the third embodiment, it is possible to exert the same effects as the effects in the first embodiment explained above.

Composite Sensor

A configuration example of a composite sensor 900 including the acceleration sensor 100 explained above is explained with reference to FIG. 10.

Figure 10:
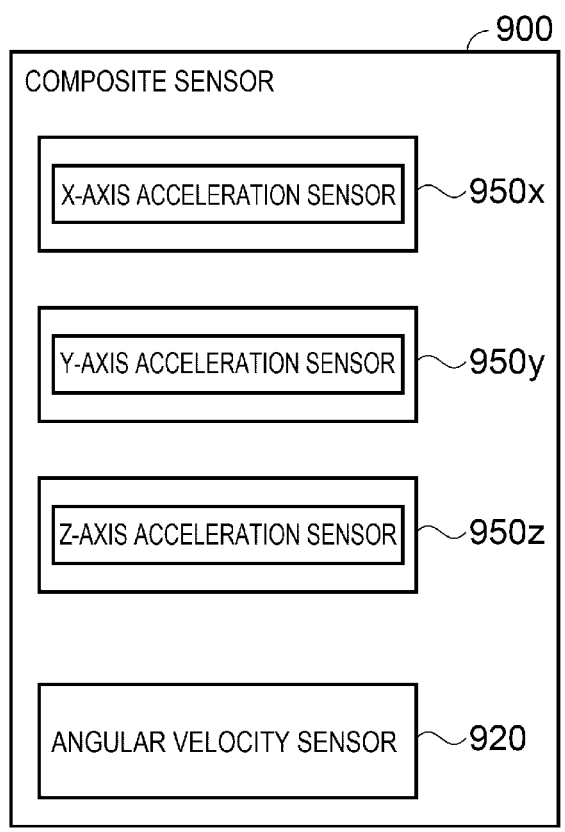
FIG. 10 is a functional block diagram showing a schematic configuration of a composite sensor.

FIG. 10 is a functional block diagram showing a schematic configuration of the composite sensor.

The composite sensor 900 includes, as shown in FIG. 10, an X-axis acceleration sensor 950x, a Y-axis acceleration sensor 950y, and a Z-axis acceleration sensor 950z including the acceleration sensor 100 capable of detecting acceleration as explained above and an angular velocity sensor 920 including an angular velocity sensor element. The X-axis acceleration sensor 950x, the Y-axis acceleration sensor 950y, and the Z-axis acceleration sensor 950z can respectively highly accurately measure acceleration in one axial direction. The angular velocity sensor 920 includes three angular velocity sensor elements in order to respectively measure angular velocities in three axial directions. The composite sensor 900 can include a control circuit section (an IC: Integrate Circuit) including, for example, a driving circuit that drives the X-axis acceleration sensor 950x, the Y-axis acceleration sensor 950y, and the Z-axis acceleration sensor 950z, a detection circuit that detects accelerations in the X-axis, Y-axis, and Z-axis directions based on signals from the X-axis acceleration sensor 950x, the Y-axis acceleration sensor 950y, and the Z-axis acceleration sensor 950z, and an output circuit that converts a signal from the detection circuit into a predetermined signal and outputs the predetermined signal.

Such a composite sensor 900 can be easily configured by the X-axis acceleration sensor 950x, the Y-axis acceleration sensor 950y, and the Z-axis acceleration sensor 950z configured by the acceleration sensor 100 functioning as the physical quantity sensor and capable of detecting acceleration as explained above and the angular velocity sensor 920. For example, the composite sensor 900 can acquire acceleration data and angular velocity data.

Inertial Measurement Unit

An inertial measurement unit (IMU) 2000 is explained with reference to FIGS. 11 and 12.

Figure 11:
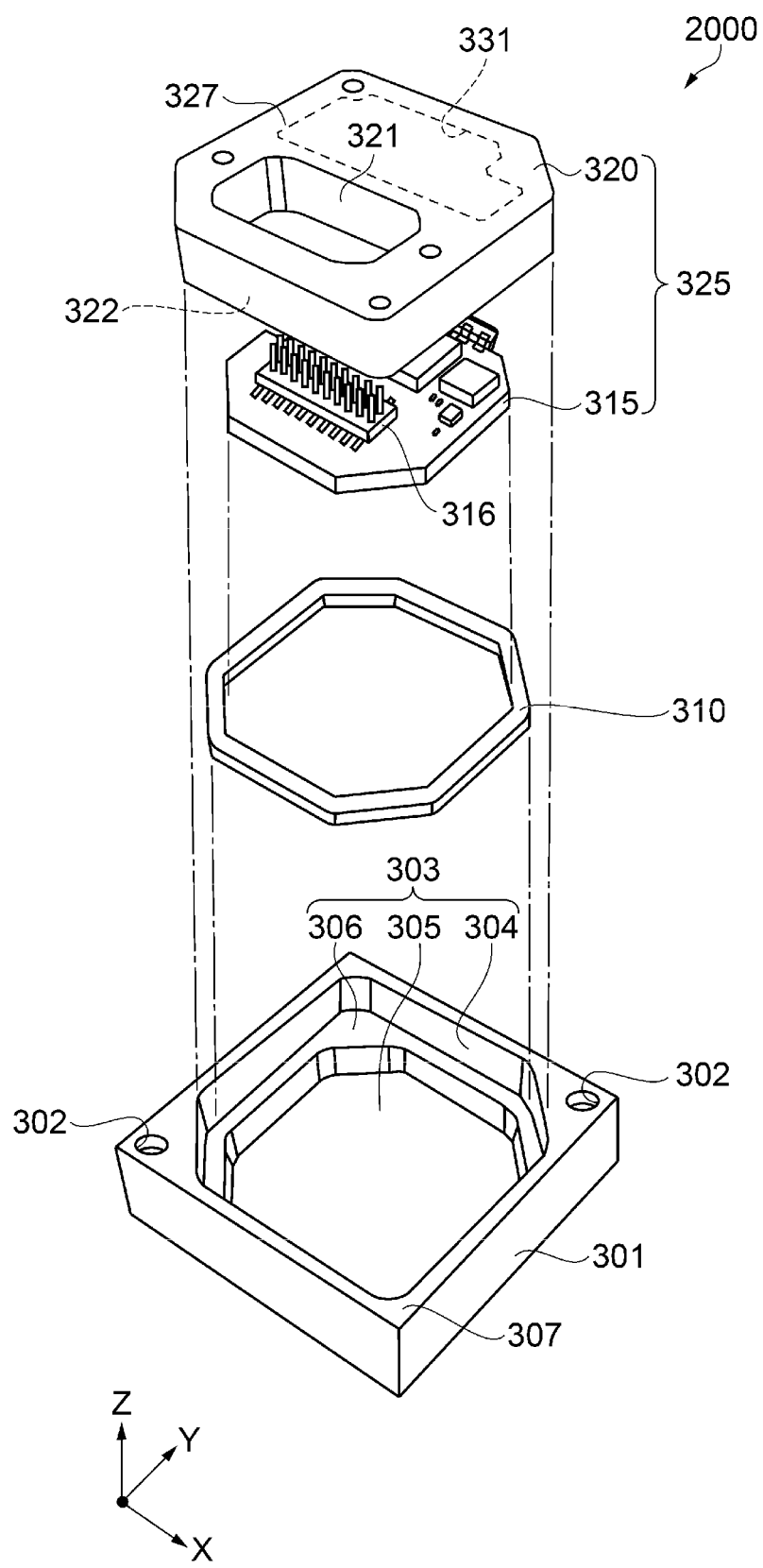
FIG. 11 is an exploded perspective view showing a schematic configuration of an inertial measurement unit.
Figure 12:
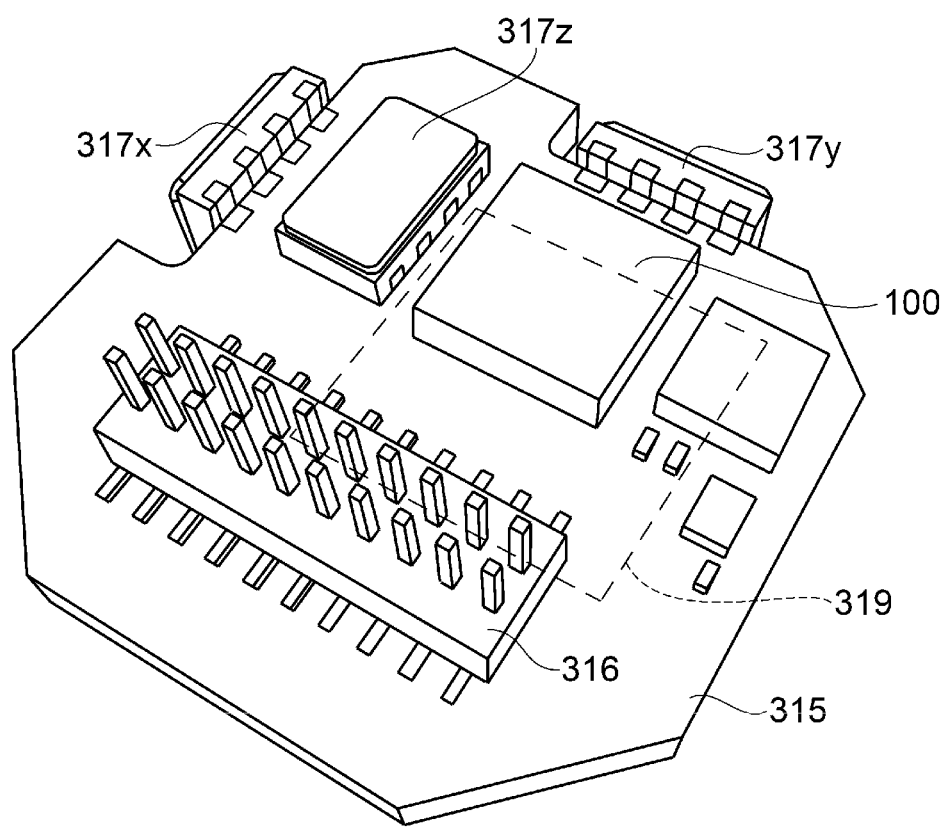
FIG. 12 is a perspective view showing a disposition example of an inertial sensor of the inertial measurement unit.

FIG. 11 is an exploded perspective view showing a schematic configuration of the inertial measurement unit. FIG. 12 is a perspective view showing a disposition example of an inertial sensor of the inertial measurement unit. In the following explanation, an example is explained in which the acceleration sensor 100 capable of detecting the acceleration Ax is used.

As shown in FIG. 11, the inertial measurement unit 2000 is configured from an outer case 301, a joining member 310, a sensor module 325 including an inertial sensor, and the like. In other words, the sensor module 325 is fit (inserted) into an inside 303 of the outer case 301 with intervention of the joining member 310. The sensor module 325 is configured from an inner case 320 and a substrate 315. To facilitate explanation, the components are referred to as outer case and inner case. However, the components may be referred to as first case and second case as well.

The outer case 301 is a pedestal obtained by cutting aluminum into a box shape. The material of the outer case 301 is not limited to aluminum. Another kind of metal such as zinc and stainless steel, resin, a composite material of metal and resin, or the like may be used. Like the overall shape of the inertial measurement unit 2000 explained above, the external shape of the outer case 301 is a rectangular parallelepiped, a planar shape of which is a substantial square. Through-holes 302 are respectively formed near vertexes in two places located in a diagonal direction of the square. Means for fixing the outer case 301 is not limited to the through-holes 302. For example, cutouts for enabling the outer case 301 to be screwed by screws (a structure in which cutouts are formed at corner portions of the outer case 301 where the through-holes 302 are located) may be formed to screw the outer case 301. Alternatively, a flange may be formed on a side surface of the outer case 301 and screwed.

The outer case 301 has a box shape, the external shape of which is a rectangular parallelepiped, without a lid. The inside 303 (the inner side) of the outer case 301 is an internal space (a container) surrounded by a bottom wall 305 and a sidewall 304. In other words, the outer case 301 is formed in a box shape, one surface of which opposed to the bottom wall 305 is an opening surface. The sensor module 325 is housed to cover most of an opening section of the opening surface (close the opening section). The sensor module 325 is exposed from the opening section (not shown in FIG. 11). The opening surface opposed to the bottom wall 305 is the same surface as an upper surface 307 of the outer case 301. A planar shape of the inside 303 of the outer case 301 is a hexagon obtained by chamfering corners of two vertex portions of the square. The chamfered two vertex portions correspond to the positions of the through-holes 302. In a sectional shape (a thickness direction) of the inside 303, in the bottom wall 305, a first joining surface 306 functioning as a bottom wall higher than the center is formed at the peripheral edge portion on the inside 303, that is, in the internal space. That is, the first joining surface 306 is a part of the bottom wall 305, is a step-wise part of one stage formed in a ring shape to planarly surround the center of the bottom wall 305, and is a surface, the distance to which from the opening surface (the same surface as the upper surface 307) is smaller than the distance from the bottom wall 305.

The example is explained above in which the external shape of the outer case 301 is the box shape, the planar shape of which is the rectangular parallelepiped of the substantial square, without the lid. However, the external shape of the outer case 301 is not limited to this. The planar shape of the external shape of the outer case 301 may be a polygon such as a hexagon or an octagon. Corners of vertex portions of the polygon may be chamfered. The planar shape may be a planar shape, sides of which are curved lines. The planar shape of the inside 303 (the inner side) of the outer case 301 is not limited to the hexagon and may be a quadrate (a quadrangle) such as a square or another polygonal shape such as an octagon. The external shape of the outer case 301 and the planar shape of the inside 303 may be similar shapes or may not be the similar shapes.

The inner case 320 is a member that supports the substrate 315. The inner case 320 is formed in a shape fit in the inside 303 of the outer case 301. In detail, planarly, the inner case 320 is a hexagon obtained by chamfering corners of two vertex portions of a square. An opening section 321, which is a rectangular through-hole, and a recess 331 provided on a surface on a side for supporting the substrate 315 on the opposite side of an upper surface 327 of the inner case 320 are formed in the inner case 320. The chamfered two vertex portions correspond to the positions of the through-holes 302 of the outer case 301. The height of the inner case 320 in the thickness direction (the Z-axis direction) is smaller than the height from the upper surface 307 to the first joining surface 306 of the outer case 301. In a preferred example, the inner case 320 is also formed by cutting aluminum. However, as in the outer case 301, other materials may be used.

On the rear surface (the surface on the outer case 301 side) of the inner case 320, guide pins for positioning the substrate 315 and a supporting surface (both of which are not shown in FIG. 11) are formed. The substrate 315 is set (positioned and mounted) on the guide pins and the supporting surface and bonded to the rear surface of the inner case 320. Details of the substrate 315 are explained below. The peripheral edge portion of the rear surface of the inner case 320 is a second joining surface 322 formed by a ring-like plane. The second joining surface 322 planarly has substantially the same shape as the first joining surface 306 of the outer case 301. When the inner case 320 is set in the outer case 301, the two surfaces are opposed to each other across the joining member 310. The structures of the outer case 301 and the inner case 320 are examples and are not limited to the structures.

The configuration of the substrate 315 mounted with the inertial sensor is explained with reference to FIG. 12. As shown in FIG. 12, the substrate 315 is a multilayer substrate on which a plurality of through-holes are formed. A glass epoxy substrate is used as the substrate 315. The substrate 315 is not limited to the glass epoxy substrate and only has to be a rigid substrate on which pluralities of inertial sensors, electronic components, connectors, and the like can be mounted. For example, a composite substrate and a ceramic substrate may be used.

On the front surface (the surface on the inner case 320 side) of the substrate 315, a connector 316, an angular velocity sensor 317z, the acceleration sensor 100 functioning as the physical quantity sensor explained above, and the like are mounted. The connector 316 is a plug-type (male) connector. The connector 316 includes coupling terminals in two rows disposed at an equal pitch in the X-axis direction. The coupling terminals are suitably coupling terminals including pins in two rows each including ten pins, that is, twenty pins in total. The number of terminals may be changed as appropriate according to design specifications.

The angular velocity sensor 317z is a gyro sensor that detects angular velocity of one axis in the Z-axis direction. As a preferred example, a vibration gyro sensor that detects angular velocity from a Coriolis force applied to a vibrating object using quartz as a transducer is used. The angular velocity sensor 317z is not limited to the vibration gyro sensor and only has to be a sensor capable of detecting angular velocity. For example, a sensor in which ceramic or silicon is used as a transducer may be used.

On the side surface in the X-axis direction of the substrate 315, an angular velocity sensor 317x that detects angular velocity of one axis in the X-axis direction is mounted such that amounting surface (a loading surface) is orthogonal to the X axis. Similarly, on the side surface in the Y-axis direction of the substrate 315, an angular velocity sensor 317y that detects angular velocity of one axis in the Y-axis direction is mounted such that a mounting surface (a loading surface) is orthogonal to the Y axis.

The angular velocity sensors 317x, 317y, and 317z are not limited to a configuration in which three angular velocity sensors for each axis are used. The angular velocity sensors 317x, 317y, and 317z only have to be sensors capable of detecting angular velocities of three axes. A sensor device capable of detecting (sensing) angular velocities of three axes with one device (package) may be used.

In the acceleration sensor 100, the acceleration sensor element piece 10 (see FIG. 5) of the capacitance type capable of detecting acceleration in one axial direction and obtained by machining, for example, a silicon substrate with a MEMS technique is used. According to necessity, the acceleration sensor 100 can be an acceleration sensor applied with an acceleration sensor element capable of detecting accelerations in two axial directions of the X axis and the Y axis or an acceleration sensor element capable of detecting accelerations in three axial directions.

A control IC 319 functioning as a control section is mounted on the rear surface (the surface on the outer case 301 side) of the substrate 315. The control IC 319 is an MCU (Micro Controller Unit). The control IC 319 incorporates a storing section including a nonvolatile memory, an A/D converter, and the like and controls the sections of the inertial measurement unit 2000. In the storing section, a program defining order and content for detecting acceleration and angular velocity, a program for digitizing detection data and incorporating the detection data in packet data, incidental data, and the like are stored. Besides, a plurality of electronic components are mounted on the substrate 315.

In such an inertial measurement unit 2000, the acceleration sensor 100 functioning as the physical quantity sensor is used. Therefore, it is possible to provide the inertial measurement unit 2000 that enjoys the effects of the acceleration sensor 100.

Vehicle Positioning Device

A vehicle positioning device 3000 is explained with reference to FIGS. 13 and 14.

Figure 13:
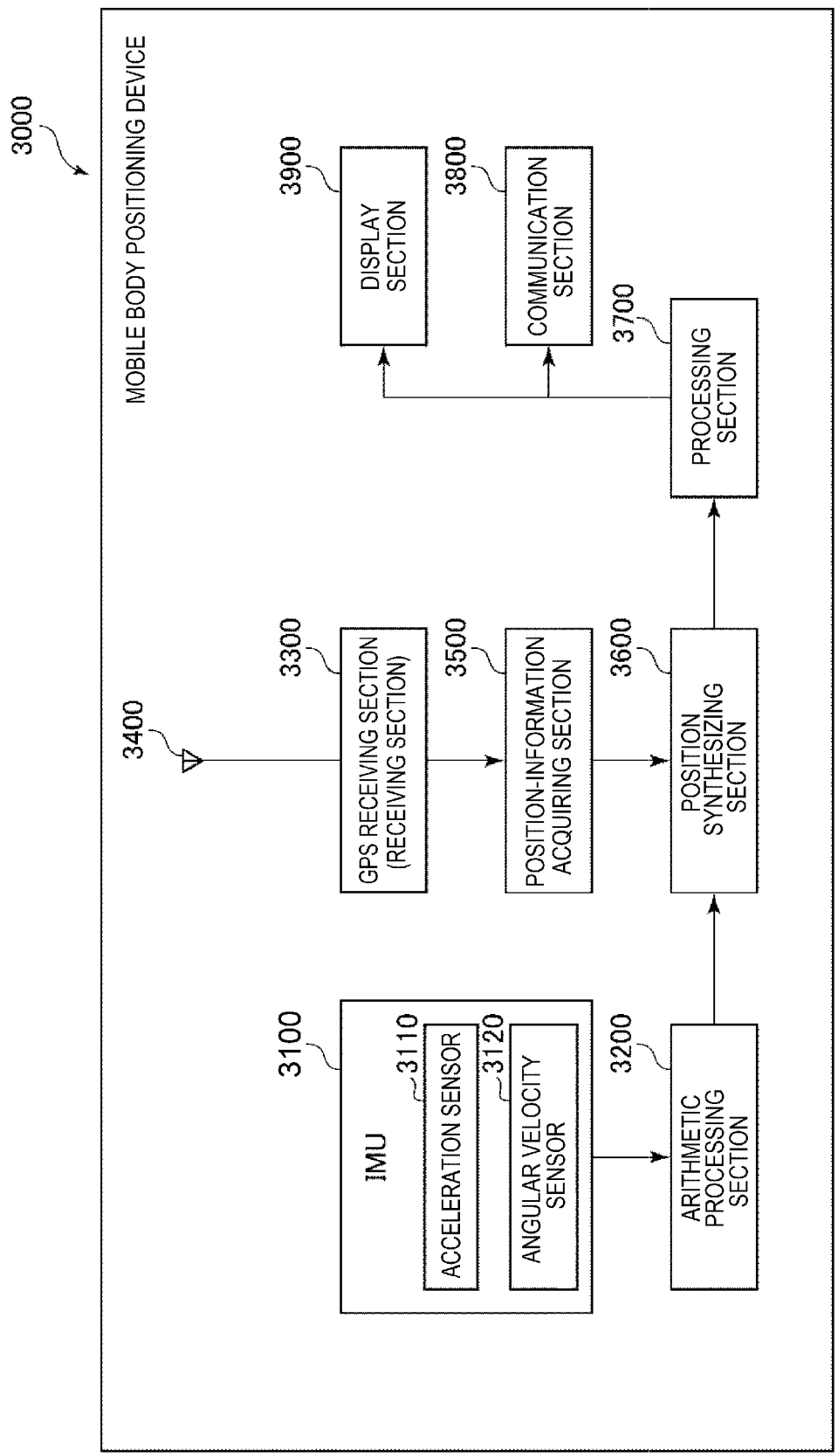
FIG. 13 is a block diagram showing an overall system of a vehicle positioning device.
Figure 14:
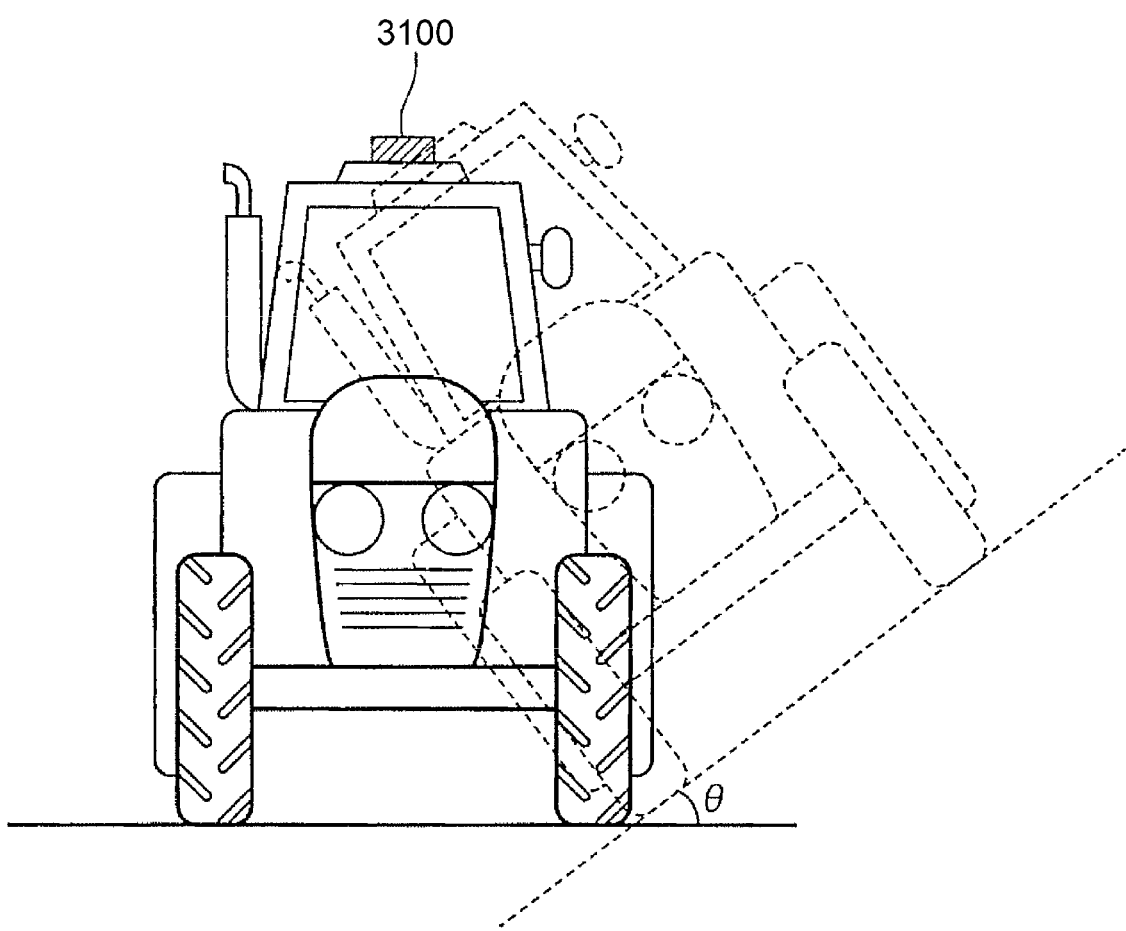
FIG. 14 is a diagram schematically showing action of the vehicle positioning device.

FIG. 13 is a block diagram showing an overall system of the vehicle positioning device. FIG. 14 is a diagram schematically showing the action of the vehicle positioning device.

The vehicle positioning device 3000 shown in FIG. is a device mounted on a vehicle and used to perform positioning of the vehicle. The vehicle is not particularly limited and may be any vehicle such as a bicycle, an automobile (including a four-wheel automobile and a motorcycle), a train, an airplane, and a ship. In the following explanation in this embodiment, the vehicle is the four-wheel automobile. The vehicle positioning device 3000 includes an inertial measurement device 3100 (IMU), an arithmetic processing section 3200, a GPS receiving section 3300, a reception antenna 3400, a position-information acquiring section 3500, a position synthesizing section 3600, a processing section 3700, a communication section 3800, and a display section 3900.

The inertial measurement device 3100 includes a three-axis acceleration sensor 3110 applied with the acceleration sensor 100 and a three-axis angular velocity sensor 3120. As the inertial measurement device 3100, the inertial measurement unit 2000 including the acceleration sensor 100 can be used. The arithmetic processing section 3200 receives acceleration data from the acceleration sensor 3110 and angular velocity data from the angular velocity sensor 3120, performs inertial navigation arithmetic processing on these data, and outputs inertial navigation positioning data (data including acceleration and a posture of the vehicle).

The GPS receiving section 3300 receives signals (GPS carrier waves; satellite signals superimposed with position information) from GPS satellites via the reception antenna 3400. The position-information acquiring section 3500 outputs, based on the signals received by the GPS receiving section 3300, GPS positioning data representing the position (the latitude, the longitude, and the altitude), the speed, and the orientation of the vehicle positioning device 3000 (the vehicle). The GPS positioning data also includes status data indicating a reception state and reception time.

The position synthesizing section 3600 calculates, based on the inertial navigation positioning data output from the arithmetic processing section 3200 and the GPS positioning data output from the position-information acquiring section 3500, the position of the vehicle, specifically, in which position on the ground the vehicle is traveling. For example, even if the position of the vehicle included in the GPS positioning data is the same, as shown in FIG. 14, if the posture of the vehicle is different because of the influence of inclination or the like of the ground, the vehicle is traveling in a different position on the ground. For this reason, an accurate position of the vehicle cannot be calculated with only the GPS positioning data. Therefore, the position synthesizing section 3600 calculates, using the inertial navigation positioning data (in particular, the data concerning the posture of the vehicle), in which position on the ground the vehicle is traveling. The calculation can be relatively easily performed by an arithmetic operation using a trigonometric function (a tilt θ with respect to the vertical direction).

The position data output from the position synthesizing section 3600 is subjected to predetermined processing by the processing section 3700. The positioning data is displayed on the display section 3900 as a positioning result. The position data may be transmitted to an external device by the communication section 3800.

The vehicle positioning device 3000 is explained above. As explained above, the vehicle positioning device 3000 includes the inertial measurement device 3100 applied with the acceleration sensor 100, the GPS receiving section 3300 (a receiving section) configured to receive a satellite signal superimposed with position information from a positioning satellite, the position-information acquiring section 3500 (an acquiring section) configured to acquire the position information of the GPS receiving section 3300 based on the received satellite signal, the arithmetic processing section 3200 (a computing section) configured to compute a posture of the vehicle based on inertial navigation positioning data (inertial data) output from the inertial measurement device 3100, and the position synthesizing section 3600 (a calculating section) configured to calculate a position of the vehicle by correcting the position information based on the computed posture. Therefore, it is possible to obtain the vehicle positioning device 3000 that can enjoy the effects of the inertial measurement unit 2000 including the acceleration sensor 100 functioning as the physical quantity sensor and has high reliability.

Portable Electronic Device

A portable electronic device including the acceleration sensor 100 is explained with reference to FIGS. 15 and 16.

Figure 15:
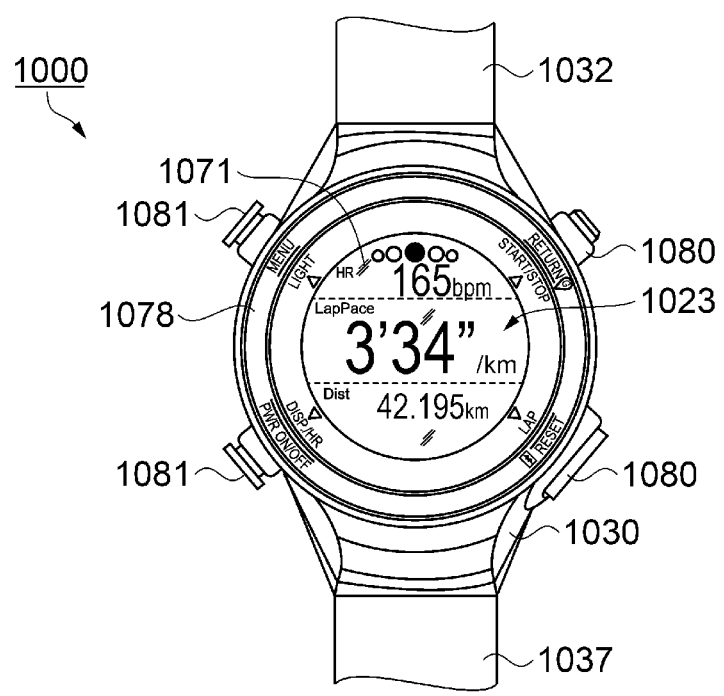
FIG. 15 is a plan view schematically showing the configuration of a portable electronic device.
Figure 16:
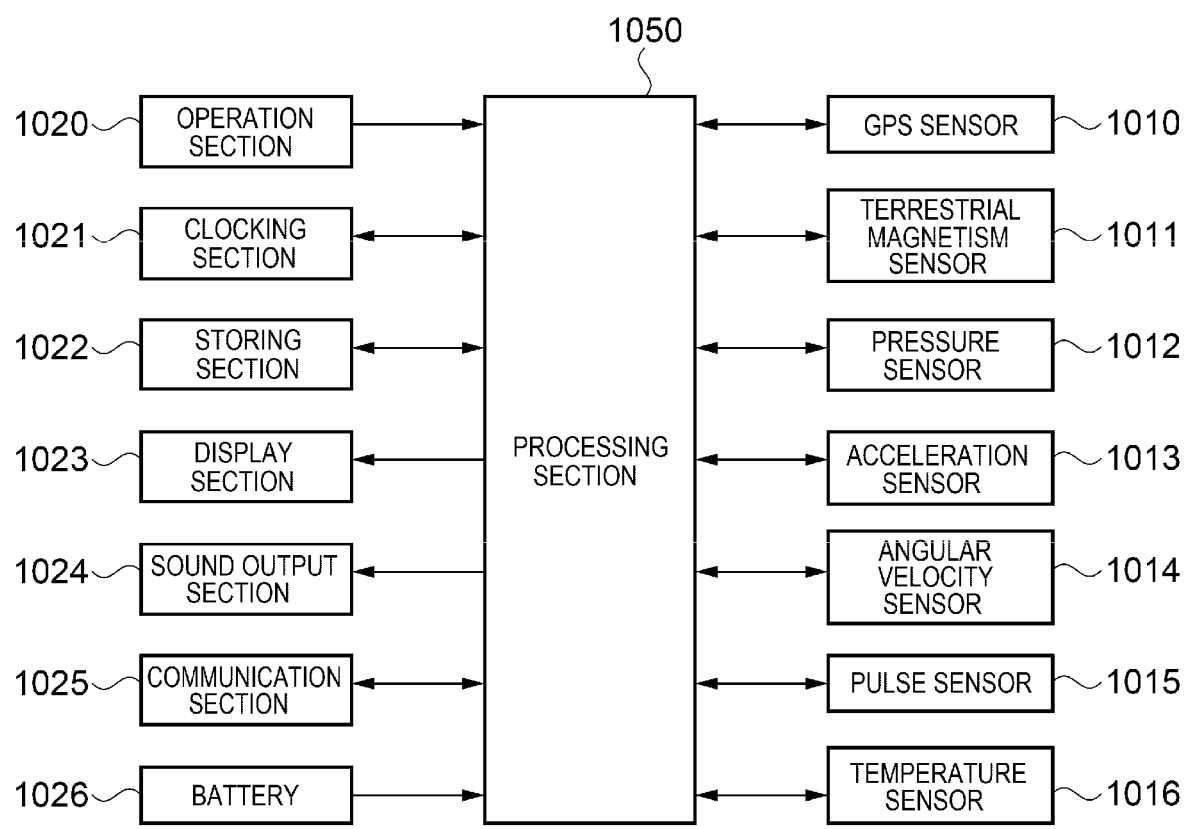
FIG. 16 is a functional block diagram showing a schematic configuration of the portable electronic device.

FIG. 15 is a plan view schematically showing the configuration of the portable electronic device. FIG. 16 is a functional block diagram showing a schematic configuration of the portable electronic device. An activity meter of a wristwatch type is explained as an example of the portable electronic device.

As shown in FIG. 15, a wrist device 1000, which is the activity meter (the active tracker) of the wristwatch type, is worn on a part (a subject) such as a wrist of a user by bands 1032 and 1037 or the like. The wrist device 1000 includes a digital display section 1023 and is capable of performing wireless communication. The acceleration sensor 100 functioning as the physical quantity sensor according to the present disclosure is incorporated in the wrist device 1000 as an acceleration sensor 1013 (see FIG. 16) that measures acceleration together with, for example, an angular velocity sensor 1014 (see FIG. 16) that measures angular velocity.

The wrist device 1000 includes a case 1030 in which at least the acceleration sensor 1013 and the angular velocity sensor 1014 (see FIG. 16) are housed, a processing section 1050 (see FIG. 16) housed in the case 1030 and configured to process output data from the acceleration sensor 1013 and the angular velocity sensor 1014, the display section 1023 housed in the case 1030, and a light-transmissive cover 1071 closing an opening section of the case 1030. A bezel 1078 is provided on the outer side of the case 1030 of the light-transmissive cover 1071 of the case 1030. A plurality of operation buttons 1080 and 1081 are provided on the side surface of the case 1030. The wrist device 1000 is explained more in detail below with reference to FIG. 16 as well.

The acceleration sensor 1013 detects accelerations in respective three axial directions crossing (ideally, orthogonal to) one another and outputs a signal (an acceleration signal) corresponding to the magnitudes and the directions of the detected three-axis accelerations. The angular velocity sensor 1014 detects angular velocities in the respective three axial directions crossing (ideally, orthogonal to) one another and outputs a signal (an angular velocity signal) corresponding to the magnitudes and the directions of the detected three-axis angular velocities.

The wrist device 1000 includes a GPS (Global Positioning System) sensor 1010. The GPS is called global positioning system as well and is a satellite positioning system for measuring a present position on the earth based on a plurality of satellite signals. The GPS has a function of performing positioning calculation using GPS time information and track information and acquiring position information of a user, a function of measuring a moving distance and a moving track of the user, and a time correcting function in a clock function. The GPS sensor 1010 can measure a present position on the earth based on satellite signals from GPS satellites.

A liquid crystal display (LCD) configuring the display section 1023 displays, according to various detection modes, for example, position information and a movement amount obtained using the GPS sensor 1010 or a terrestrial magnetism sensor 1011, exercise information such as an exercise amount obtained using the acceleration sensor 1013, the angular velocity sensor 1014, or the like, biological information such as a pulse rate obtained using a pulse sensor 1015 or the like, or time information such as present time. The liquid crystal display (LCD) can also display an environmental temperature obtained using a temperature sensor 1016.

A communication section 1025 performs various kinds of control for establishing communication between a user terminal and a not-shown information terminal. The communication section 1025 includes a transceiver corresponding to a short range wireless communication standard such as Bluetooth (registered trademark) (including BTLE: Bluetooth Low Energy), Wi-Fi (registered trademark) (Wireless Fidelity), Zigbee (registered trademark), NFC (Near field communication), or ANT+(registered trademark) and a connector corresponding to a communication bus standard such as USB (Universal Serial Bus).

The processing section 1050 (a processor) is configured by, for example, an MPU (Micro Processing Unit), a DSP (Digital Signal Processor), or an ASIC (Application Specific Integrated Circuit). The processing section 1050 executes various kinds of processing based on programs stored in a storing section 1022 and signals input from an operation section 1020 (e.g., the operation buttons 1080 and 1081). The processing by the processing section 1050 includes data processing on output signals of the GPS sensor 1010, the terrestrial magnetism sensor 1011, a pressure sensor 1012, the acceleration sensor 1013, the angular velocity sensor 1014, the pulse sensor 1015, the temperature sensor 1016, and a clocking section 1021, display processing for causing the display section 1023 to display an image, sound output processing for causing a sound output section 1024 to output sound, communication processing for performing communication with the information terminal via the communication section 1025, and power control processing for supplying electric power from a battery 1026 to the sections.

The list device 1000 can have at least the following functions.

1. Distance: measuring a total distance from a measurement start with a highly accurate GPS function.
2. Pace: displaying a present running pace from a pace distance measurement value.
3. Average speed: calculating and displaying average speed from a running start to the present.
4. Altitude: measuring and displaying altitude with the GPS function.
5. Stride: measuring and displaying a step size even in a tunnel where a GPS radio wave does not reach.
6. Pitch: measuring and displaying the number of steps per one minute.
7. Heart rate: measuring and displaying a heart rate with a pulse sensor.
8. Gradient: measuring and displaying a gradient of the ground in training or trail run in a mountainous area.
9. Auto lap: automatically performing lap measurement at the time when a user runs a fixed distance or a fixed time set beforehand.
10. Exercise consumed calorie: displaying a consumed calorie.
11. Number of steps: displaying a total of the number of steps from an exercise start.

The wrist device 1000 can be widely applied to a running watch, a runner's watch, a runner's watch adapted to multiple sports such as duathlon and triathlon, an outdoor watch, and a GPS watch implemented with a satellite positioning system, for example, a GPS.

In the above explanation, the GPS (Global Positioning System) is used as the satellite positioning system. However, another global navigation satellite system (GNSS) may be used. For example, one or two or more of satellite positioning systems such as an EGNOS (European Geostationary Satellite Navigation Overlay Service), a QZSS (Quasi Zenith Satellite System), a GLONASS (Global Navigation Satellite System), a GALILEO, and BeiDou (BeiDou Navigation Satellite System) may be used. A satellite based augmentation system (SBAS) such as a WAAS (Wide Area Augmentation System) or an EGNOS (European Geostationary Satellite Navigation Overlay System) may be used in at least one of the satellite positioning systems.

Such a portable electronic device includes the acceleration sensor 100 functioning as the physical quantity sensor and the processing section 1050. Therefore, the portable electronic device is compact and has excellent reliability.

Electronic Device

An electronic device including the acceleration sensor 100 is explained with reference to FIGS. 17, 18, and 19.

First, a mobile personal computer 1100, which is an example of the electronic device, is explained with reference to FIG. 17. FIG. 17 is a perspective view schematically showing the configuration of the mobile personal computer, which is an example of the electronic device.

In this figure, the personal computer 1100 is configured by a main body section 1104 including a keyboard 1102 and a display unit 1106 including a display section 1108. The display unit 1106 is turnably supported with respect to the main body section 1104 via a hinge structure section. In such a personal computer 1100, the acceleration sensor 100 is incorporated. A control section 1110 can perform control such as posture control based on detection data of the acceleration sensor 100.

A smartphone 1200, which is an example of the electronic device, is explained with reference to FIG. 18. FIG. 18 is a perspective view schematically showing the configuration of the smartphone (a cellular phone), which is an example of the electronic device.

Figure 18:
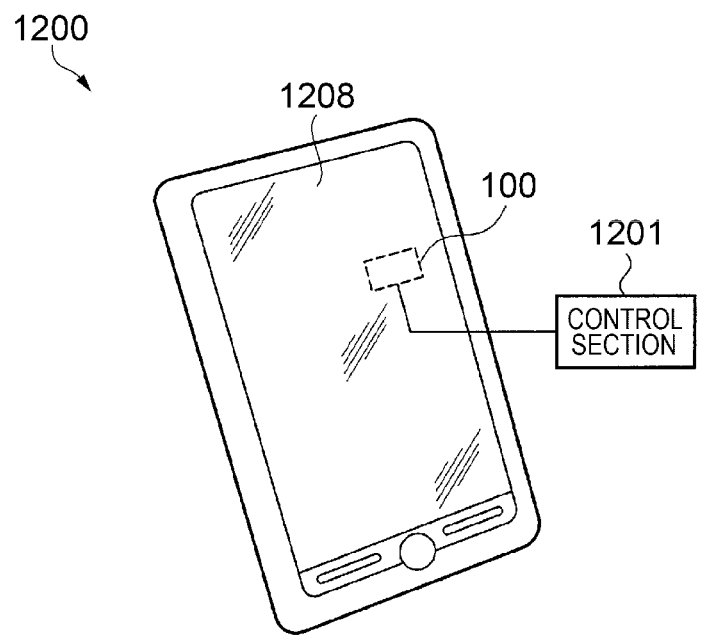
FIG. 18 is a perspective view schematically showing the configuration of a smartphone (a cellular phone), which is an example of the electronic device.

In FIG. 18, the acceleration sensor 100 is incorporated in the smartphone 1200. Detection data (acceleration data) detected by the acceleration sensor 100 is transmitted to a control section 1201 of the smartphone 1200. The control section 1201 includes a CPU (Central Processing Unit). The control section 1201 can recognize a posture and a behavior of the smartphone 1200 from the received detection data, change a display image displayed on a display section 1208, emit alarm sound or sound effects, and drive a vibration motor to vibrate a main body. In other words, the control section 1201 can perform motion sensing of the smartphone 1200 and change display content and generate sound, vibration, and the like according to a measured posture and a measured behavior. In particular, when a game application is executed, it is possible to enjoy presence similar to the reality.

A digital still camera 1300, which is an example of the electronic device, is explained with reference to FIG. 19. FIG. 19 is a perspective view showing the configuration of the digital still camera, which is an example of the electronic device. In FIG. 19, coupling to external devices is briefly shown.

Figure 19:
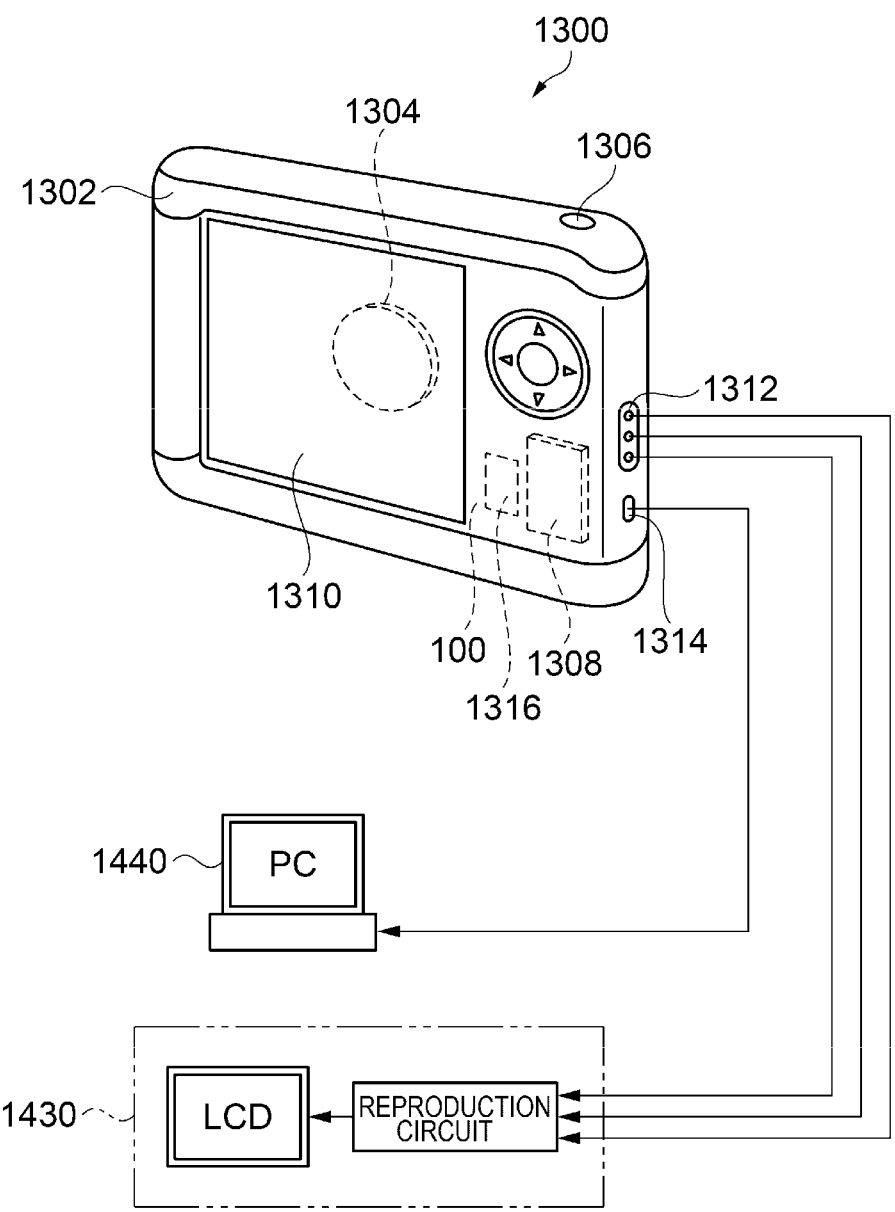
FIG. 19 is a perspective view showing the configuration of a digital still camera, which is an example of the electronic device.

In FIG. 19, a display section 1310 is provided on the back of a case 1302 of the digital still camera 1300. The display section 1310 performs display based on an imaging signal by a CCD. The display section 1310 also functions as a finder that displays an object as an electronic image. A light receiving unit 1304 including an optical lens (an imaging optical system) and a CCD is provided on the front side (the rear side in FIG. 19) of the case 1302.

When a photographer confirms an object image displayed on the display section 1310 and presses a shutter button 1306, an imaging signal of the CCD at that point in time is transferred to and stored in a memory 1308. In the digital still camera 1300, a video signal output terminal 1312 and an input and output terminal 1314 for data communication are provided on a side surface of the case 1302. As shown in FIG. 19, a television monitor 1430 is coupled to the video signal output terminal 1312 and a personal computer 1440 is coupled to the input and output terminal 1314 for data communication according to necessity. Further, the imaging signal stored in the memory 1308 is output to the television monitor 1430 and the personal computer 1440 according to predetermined operation. In the digital still camera 1300, the acceleration sensor 100 is incorporated. The control section 1316 can perform control such as camera shake correction based on detection data of the acceleration sensor 100.

Such an electronic device includes the acceleration sensor 100 functioning as the physical quantity sensor and the control sections 1110, 1201, and 1316. Therefore, the electronic device is compact and has excellent reliability.

Figure 17:
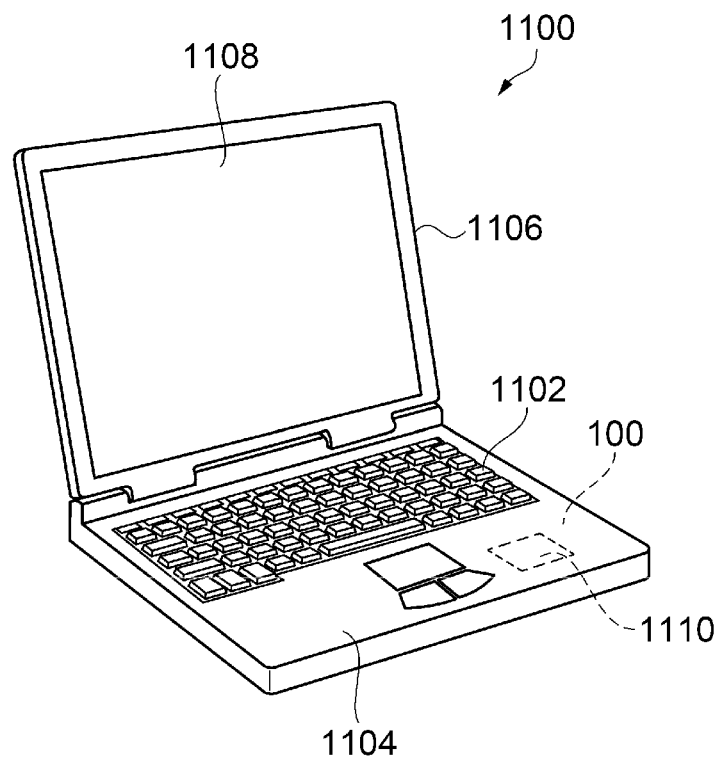
FIG. 17 is a perspective view schematically showing the configuration of a mobile personal computer, which is an example of an electronic device.

The electronic device including the acceleration sensor 100 functioning as the physical quantity sensor can be applied to, besides the personal computer 1100 shown in FIG. 17, the smartphone 1200 shown in FIG. 18, and the digital still camera 1300 shown in FIG. 19, for example, a tablet terminal, a clock, an inkjet discharge device (e.g., an inkjet printer), a laptop personal computer, a television, a video camera, a video tape recorder, a car navigation device, a pager, an electronic notebook (including an electronic notebook with a communication function), an electronic dictionary, an electronic calculator, an electronic game machine, a word processor, a work station, a video phone, a television monitor for crime prevention, an electronic binocular, a POS terminal, medical devices (e.g., an electronic thermometer, a manometer, a blood glucose meter, an electrocardiographic device, an ultrasonic diagnosis device, and an electronic endoscope), a fish finder, various measurement devices, meters (e.g., meters of a vehicle, an airplane, and a ship), a flight simulator, a seismometer, a pedometer, an inclinometer, a vibration meter that measures vibration of a hard disk, a posture control device of a robot or a flying object such as a drone, and a control device used for inertial navigation for automatic driving of an automobile.

Vehicle

A vehicle including the acceleration sensor 100 is explained with reference to FIG. 20.

Figure 20:
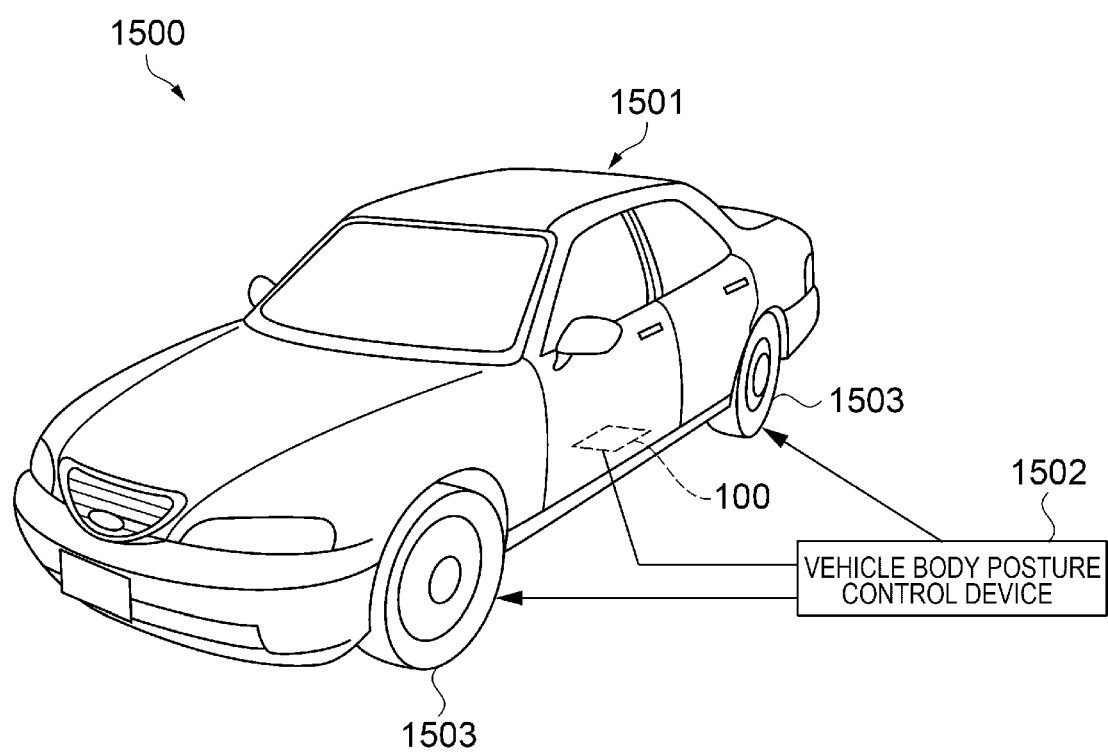
FIG. 20 is a perspective view showing the configuration of an automobile, which is an example of a vehicle.

FIG. 20 is a perspective view showing the configuration of an automobile, which is an example of the vehicle.

As shown in FIG. 20, the acceleration sensor 100 functioning as an example of the physical quantity sensor is incorporated in an automobile 1500. For example, movement (a position) and a posture of a vehicle body 1501 can be detected by the acceleration sensor 100. A detection signal of the acceleration sensor 100 is supplied to a vehicle body posture control device 1502 that controls the movement and the posture of the vehicle body 1501. The vehicle body posture control device 1502 can detect a posture of the vehicle body 1501 based on the signal, control hardness and softness of a suspension according to a result of the detection, and control brakes of respective wheels 1503.

Besides, the acceleration sensor 100 can be widely applied to a keyless entry system, an immobilizer, a car navigation system, a car air conditioner, an antilock brake system (ABS), an airbag, a tire pressure monitoring system (TPMS), an engine control system (an engine system), a control device for inertial navigation for automatic driving, and an electronic control unit (ECU) such as a battery monitor of a hybrid automobile and an electric automobile.

The acceleration sensor 100 functioning as the physical quantity sensor applied to the vehicle can be used in, besides the above illustration, for example, movement and posture control for a bipedal walking robot, a train, and the like, remote control for a radio-controlled airplane, a radio-controlled helicopter, a drone, and the like and movement and posture control for an autonomous flying object, movement and posture control for an agricultural machine, a construction machine, and the like, and control of a rocket, an artificial satellite, a ship, and an AGV (an unmanned carrier). As explained above, in realizing the movement (position) and posture control for the various vehicles, the acceleration sensor 100, the respective control sections (not shown in FIG. 20), and the posture control sections are incorporated in the vehicles.

Such a vehicle includes the acceleration sensor 100 functioning as the physical quantity sensor and the control section (e.g., the vehicle body posture control device 1502 functioning as the posture control section). Therefore, the vehicle is compact and has excellent reliability.

Traveling Supporting System

A traveling supporting system 4000 including a sensor unit 4032 including the acceleration sensor 100 is explained with reference to FIGS. 21 and 22.

Figure 21:
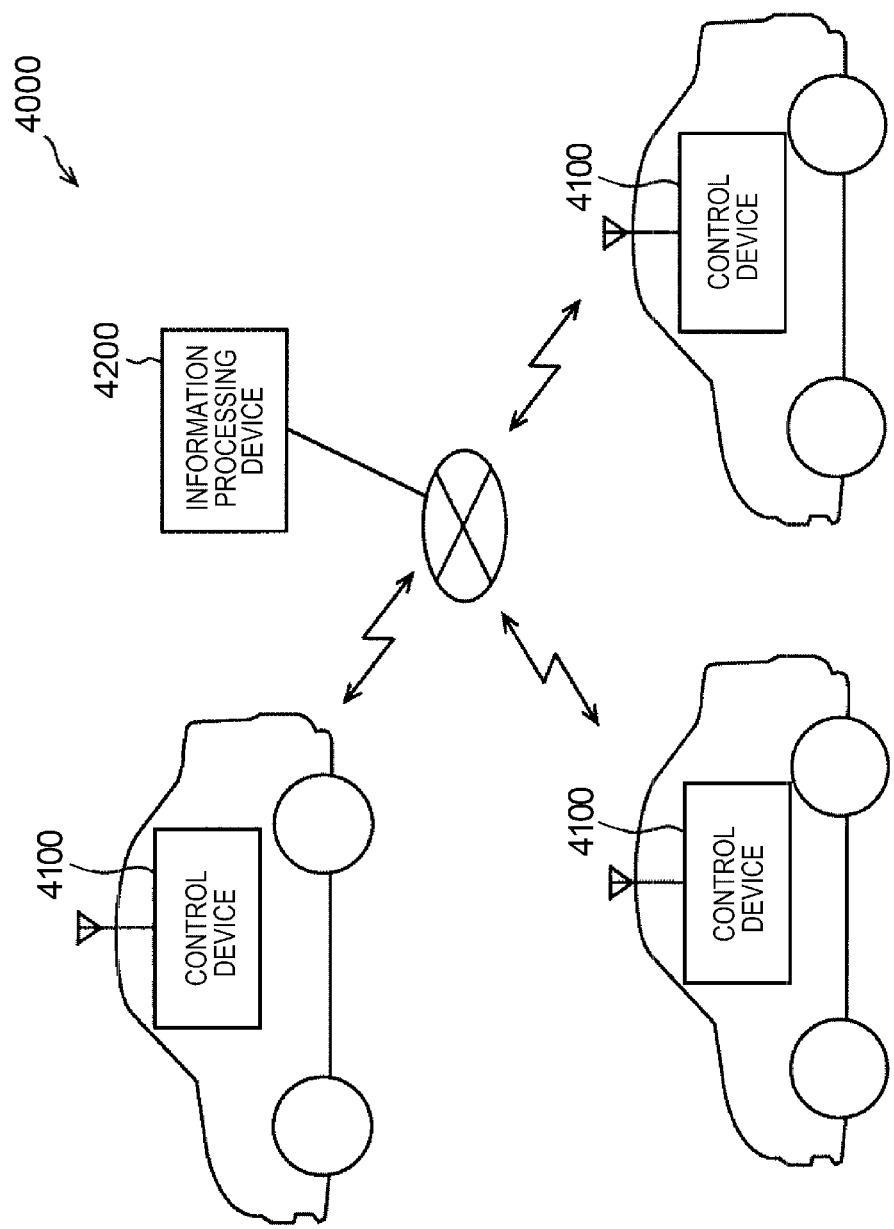
FIG. 21 is a diagram showing a schematic configuration of a traveling supporting system.

FIG. 21 is a diagram showing a schematic configuration of the traveling supporting system. FIG. 22 is a functional block diagram showing a schematic configuration of the traveling supporting system.

Schematic Configuration of the Traveling Supporting System

As shown in FIG. 21, the traveling supporting system 4000 includes control devices 4100 respectively mounted on a plurality of vehicles and an information processing device 4200.

The control device 4100 is mounted on a vehicle that performs automatic driving for automatically controlling at least any one of acceleration, braking, and steering (hereinafter, automatic driving vehicle). The control device 4100 performs communication with the information processing device 4200. The information processing device 4200 is, for example, a server device. The information processing device 4200 collects vehicle information transmitted from the control devices 4100 mounted on a plurality of automatic driving vehicles and transmits information obtained based on the collected vehicle information to the control devices 4100. The information processing device 4200 may be configured from one server device or may be configured from a plurality of server devices.

Schematic Configuration of the Control Device

A schematic configuration of the control device 4100 is explained with reference to FIG. 22. The control device 4100 is mounted on an automatic driving vehicle. As shown in FIG. 22, the control device 4100 includes an automatic driving unit 4010, a communicator 4020, an ADAS (Advanced Driver Assistance Systems) locator 4030, an HMI (Human Machine Interface) system 4040, a periphery monitoring sensor 4050, and a vehicle control unit 4060. The automatic driving unit 4010 functioning as a control section, the communicator 4020, the ADAS locator 4030, the HMI system 4040, and the vehicle control unit 4060 are coupled to, for example, an in-vehicle LAN and can exchange information with one another through communication.

The communicator 4020 performs communication with the outside of the vehicle. The communicator 4020 can perform wireless communication with, for example, at least one of a vehicle-mounted communicator mounted on a peripheral vehicle of the vehicle and a roadside machine set on a roadside. For example, the communicator 4020 can acquire position information, traveling speed information, and the like of the peripheral vehicle of the vehicle through inter-vehicle communication with the vehicle-mounted communicator and road-to-vehicle communication with the roadside machine.

The communicator 4020 performs communication with the information processing device 4200. When performing communication with the information processing device 4200, the communicator 4020 only has to be configured to perform communication with the information processing device 4200 with a vehicle-mounted communication module used for telematics communication such as a DCM (Data Communication Module) via a communication network used in the telematics communication. The communicator 4020 may be configured to perform communication with the information processing device 4200 via the roadside machine and a communication network between the roadside machine and the information processing device 4200. The communicator 4020 outputs information acquired from the information processing device 4200 to the in-vehicle LAN and transmits vehicle information transmitted from the automatic driving unit 4010 via the in-vehicle LAN.

A vehicle-mounted communication module that performs wireless communication with at least one of the vehicle-mounted communicator mounted on the peripheral vehicle and the roadside machine set on the roadside and the vehicle-mounted communication module used for the telematics communication may be separately provided or may be integrally provided.

The ADAS locator 4030 includes a GNSS (Global Navigation Satellite System) receiver 4031, the sensor unit 4032 including the acceleration sensor 100, and a map database (hereinafter, DB) 4033 in which map data is stored. The GNSS receiver 4031 receives positioning signals from a plurality of artificial satellites. The sensor unit 4032 including the acceleration sensor 100 includes, for example, a three-axis gyro sensor and a three-axis acceleration sensor. The map DB 4033 is a nonvolatile memory and has stored therein link data, node data, map data such as road shapes and structures.

The ADAS locator 4030 combines a positioning signal received by the GNSS receiver 4031 and a measurement result of the sensor unit 4032 to thereby sequentially position vehicle positions of the vehicle mounted with the ADAS locator 4030. For the positioning of the vehicle position, a traveling distance calculated from pulse signals sequentially output from a wheel speed sensor (not shown in FIG. 22) mounted on the vehicle may also be used. The ADAS locator 4030 outputs the positioned vehicle position to the in-vehicle LAN. The ADAS locator 4030 reads out the map data from the map DB 4033 and outputs the map data to the in-vehicle LAN. The ADAS locator 4030 may acquire map data from the outside of the vehicle using a vehicle-mounted communication module (not shown in FIG. 22) such as a DCM mounted on the vehicle.

Figure 22:
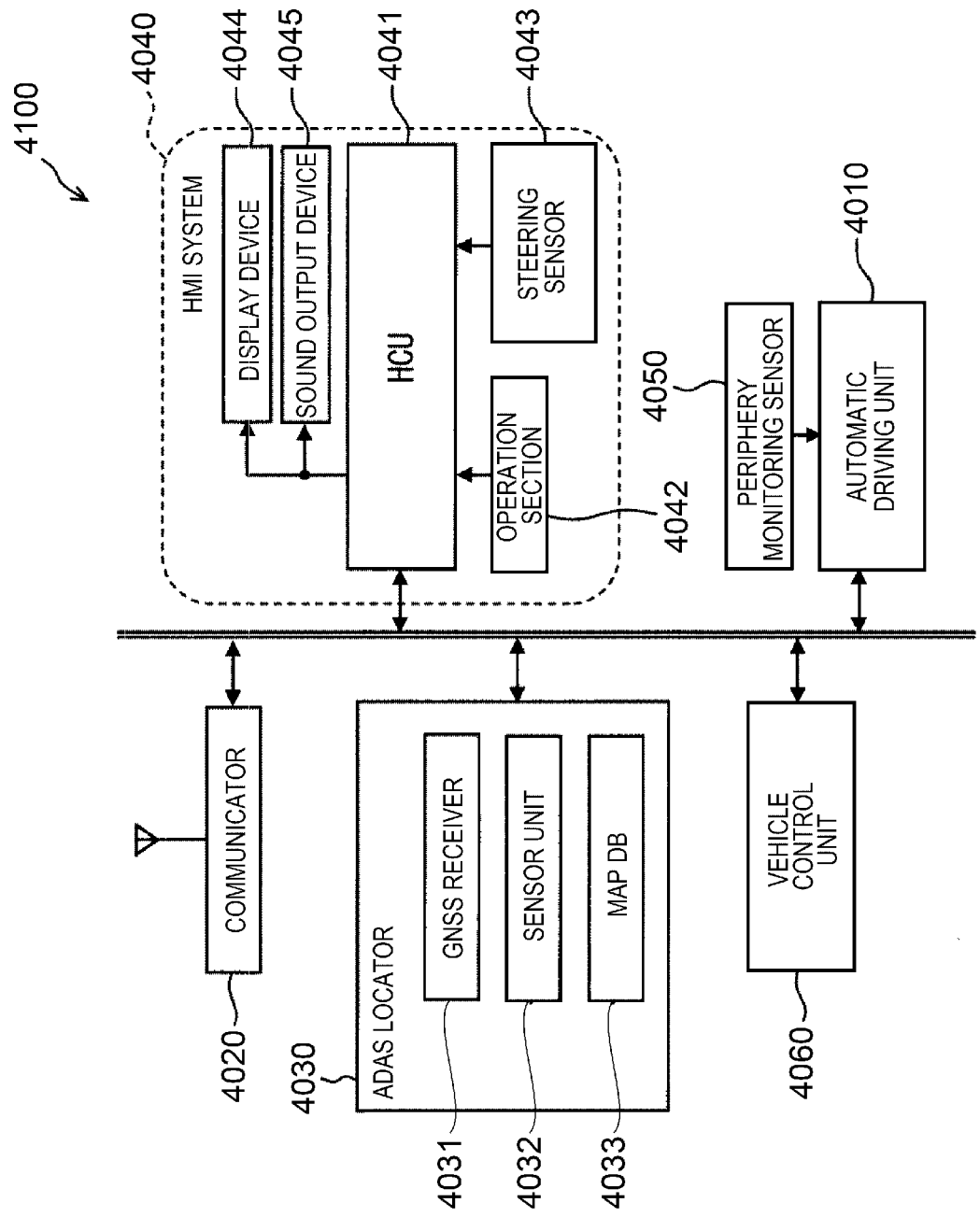
FIG. 22 is a functional block diagram showing a schematic configuration of the traveling supporting system.

The HMI system 4040 includes, as shown in FIG. 22, an HCU (Human Machine Interface Control Unit) 4041, an operation section 4042, a steering sensor 4043, a display device 4044, and a sound output device 4045. The HMI system 4040 receives input operation from a driver of the vehicle, presents information to the driver of the vehicle, and detects a state of the driver of the vehicle.

The operation section 4042 is a switch group operated by the driver of the vehicle. The operation section 4042 is used for performing various kinds of setting. For example, as the operation section 4042, there are a steering switch provided in a spoke section of a steering wheel of the vehicle, a touch switch integrated with the display device 4044, and the like.

The steering sensor 4043 is a sensor for detecting that an occupant is touching the steering wheel of the vehicle. Examples of the steering sensor 4043 include a touch sensor provided in the steering wheel and a steering torque sensor that detects steering torque of the steering wheel of the vehicle. A detection result in the steering sensor 4043 is output to the HCU 4041.

As the display device 4044, there are, for example, a combination meter, a CID (Center Information Display), and an HUD (Head-Up Display). The combination meter is disposed in front of a driver's seat of the vehicle. The CID is disposed above a center cluster in a vehicle interior of the vehicle. The combination meter and the CID display various images for information presentation on a display screen of a display based on image data acquired from the HCU 4041. The HUD projects light of an image based on the image data acquired from the HCU 4041 onto a projection region specified in a windshield of the vehicle. The light of the image reflected to the vehicle interior side by the windshield is sensed by the driver seated on the driver's seat. The driver is capable of visually recognizing a virtual image of the image projected by the HUD while superimposing the virtual image on an external scene in front of the vehicle.

As the sound output device 4045, there is, for example, an audio speaker. The audio speaker is disposed in, for example, a lining of a door of the vehicle. The audio speaker presents information to the occupant such as the driver with reproduced sound.

The HCU 4041 includes a CPU, memories such as a ROM and a RAM, an I/O, and a bus that couples the foregoing. The HCU 4041 executes a control program stored in the memories to execute various kinds of processing. For example, the HCU 4041 causes, according to an instruction from the automatic driving unit 4010, at least one of the display device 4044 and the sound output device 4045 to present information. A part or all of functions executed by the HCU 4041 may be configured in a hardware manner by one or a plurality of ICs or the like.

The periphery monitoring sensor 4050 detects obstacles including moving objects such as pedestrians, animals other than humans, bicycles, motorbikes, and other vehicles and stationary objects such as fallen objects on roads, guardrails, curbstones, and trees. Besides, the periphery monitoring sensor 4050 detects road markings such as traveling section lines and stop lines. The periphery monitoring sensor 4050 is a sensor such as a periphery monitoring camera that images a predetermined range around the vehicle, a millimeter wave radar that transmits a probing wave to a predetermined range around the vehicle, a sonar, or an LIDAR (Light Detection and Ranging/Laser Imaging Detection and Ranging).

As the periphery monitoring camera, a stereo camera may be used or a monocular camera may be used. The periphery monitoring camera sequentially outputs sequentially captured images to the automatic driving unit 4010 as sensing information. The sensor that transmits a probing wave such as the sonar, the millimeter wave radar, or the LIDAR sequentially outputs scanning results based on reception signals obtained when a reflected wave reflected by an obstacle is received to the automatic driving unit 4010 as sensing information. A plurality of kinds of periphery monitoring sensors 4050 may have overlapping sensing ranges. For example, sensing of the front of the vehicle may be performed concurrently using the periphery monitoring camera and the millimeter wave radar.

The vehicle control unit 4060 is an electronic control device that performs at least one of acceleration and deceleration control and steering control of the vehicle. As the vehicle control unit 4060, there are a steering ECU that performs the steering control, a power unit control ECU that performs the acceleration and deceleration control, a brake ECU, and the like. The vehicle control unit 4060 acquires detection signals output from sensors such as an accelerator position sensor, a brake stepping force sensor, a steering angle sensor, and a wheel speed sensor mounted on the vehicle and outputs control signals to traveling control devices such as an electronic control throttle, a brake actuator, an EPS (Electric Power Steering) motor. The vehicle control unit 4060 is capable of outputting the detection signals of the sensors to the in-vehicle LAN.

The automatic driving unit 4010 functioning as the control section includes a CPU, a volatile memory, a nonvolatile memory, an I/O, and a bus that couples the foregoing. The automatic driving unit 4010 executes a control program stored in the nonvolatile memory to execute various kinds of processing. For example, the automatic driving unit 4010 recognizes a traveling environment of the vehicle from a sensing result in the periphery monitoring sensor 4050. Besides, the automatic driving unit 4010 controls the vehicle control unit 4060 to thereby execute driving operation on behalf of the driver. The automatic driving unit 4010 is equivalent to a traveling supporting device. A part or all of functions executed by the automatic driving unit 4010 may be configured in a hardware manner by one or a plurality of ICs or the like.

The automatic driving unit 4010 functioning as the control section can instruct the vehicle control unit 4060 based on a detection signal detected by the sensor unit 4032 to control at least any one of acceleration, braking, and steering. The automatic driving unit 4010 can switch, according to a change of the detection signal detected by the sensor unit 4032, whether automatic driving is carried out or not. With the automatic driving unit 4010 functioning as the control section that controls at least any one of acceleration, braking, and steering in this way, it is possible to accurately switch, according to a change of the detection signal detected by the sensor unit 4032, whether automatic driving is carried out or not.

Such a traveling supporting system 4000 has excellent reliability because the traveling supporting system 4000 includes the sensor unit 4032 including the acceleration sensor 100 functioning as the physical quantity sensor and the automatic driving unit 4010 functioning as the traveling supporting device including the sensor unit 4032.

Head-Mounted Display Device

A head-mounted display device 5000 functioning as an example of a display device including a sensor unit (a first sensor 566 and a second sensor 568) including the acceleration sensor 100 is explained below with reference to FIG. 23.

Figure 23:
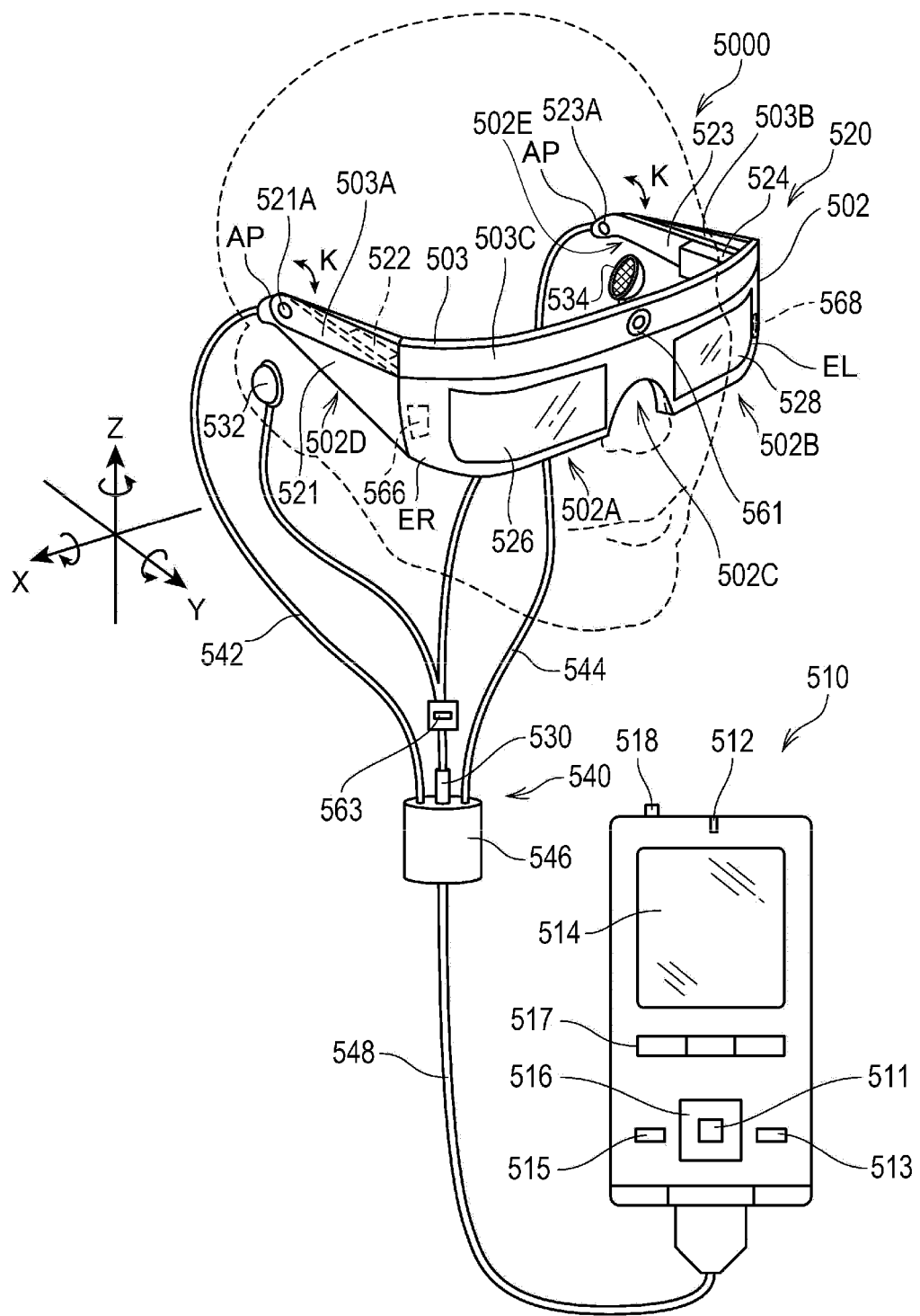
FIG. 23 is an explanatory diagram showing a schematic configuration of a head-mounted display device.

FIG. 23 is an explanatory diagram showing a schematic configuration of the head-mounted display device.

As shown in FIG. 23, the head-mounted display device 5000 functioning as an example of the display device includes an image display section 520 configured to cause a user to visually recognize a virtual image in a state in which the image display section 520 is worn on the head of the user and a control device 510 configured to control the image display section 520. The control device 510 also functions as a controller for the user to operate the head-mounted display device 5000.

The image display section 520 is a wearing body worn on the head of the user. In this embodiment, the image display section 520 includes a frame 502 having an eyeglass shape. The frame 502 includes a right holding section 521 and a left holding section 523. The right holding section 521 is a member provided to extend from an end portion ER, which is the other end, of a right optical-image display section 526 to a position corresponding to the temporal region of the user when the user wears the image display section 520. Similarly, the left holding section 523 is a member provided to extend from an end portion EL, which is the other end, of a left optical-image display section 528 to a position corresponding to the temporal region of the user when the user wears the image display section 520. The right holding section 521 is in contact with the right ear or the vicinity of the right ear on the head of the user and the left holding section 523 is in contact with the left ear or the vicinity of the left ear on the head of the user to hold the image display section 520 on the head of the user.

A right display driving section 522, a left display driving section 524, the right optical-image display section 526, the left optical-image display section 528, and a microphone 563 are provided in the frame 502. In this embodiment, the frame 502 of an eyeglass type is illustrated as an example of the main body. The shape of the main body is not limited to the eyeglass type and only has to be worn on the head of the user and fixed. The shape of the main body is more desirably a shape worn to extend in front of the left and right eyes of the user. For example, besides the eyeglass type explained here, the shape may be a snow goggles-like shape that covers an upper part of the face of the user or may be a shape disposed in front of the respective left and right eyes of the user like a binocular.

The frame 502 of the eyeglass type includes a right section 502A located in front of the right eye of the user and a left section 502B located in front of the left eye of the user. The frame 502 has a shape formed by coupling the right section 502A and the left section 502B in abridge section 502C (a coupling section). The bridge section 502C couples the right section 502A and the left section 502B in a position corresponding to the middle of the forehead of the user when the user wears the image display section 520.

The right section 502A and the left section 502B are respectively coupled to temple sections 502D and 502E. The temple sections 502D and 502E support the frame 502 on the head of the user like temples of an eyeglass. In this embodiment, the temple section 502D is configured by the right holding section 521 and the temple section 502E is configured by the left holding section 523.

The right optical-image display section 526 is disposed in the right section 502A. The left optical-image display section 528 is disposed in the left section 502B. The right optical-image display section 526 and the left optical-image display section 528 are respectively located in front of the right and left eyes of the user when the user wears the image display section 520.

The right display driving section 522 and the left display driving section 524 are disposed on sides opposed to the head of the user when the user wears the image display section 520. The right display driving section 522 and the left display driving section 524 are collectively simply referred to as "display driving sections" as well. The right optical-image display section 526 and the left optical-image display section 528 are collectively simple referred to as "optical-image display sections" as well. The display driving sections 522 and 524 include liquid crystal displays, projection optical systems, and the like not shown in FIG. 23.

The right optical-image display section 526 and the left optical-image display section 528 include light guide plates and dimming plates not shown in FIG. 23. The light guide plates are formed of light transmissive resin. The light guide plates guide image lights output by the display driving sections 522 and 524 to the eyes of the user. The dimming plates are thin plate-like optical elements and are disposed to cover the front side of the image display section 520, which is the opposite side of the side of the eyes of the user. As the dimming plates, it is possible to use various dimming plates such as a dimming plate having almost no light transmissivity, a dimming plate nearly transparent, a dimming plate that attenuates a light amount and transmits light, and a dimming plate that attenuates or reflects light having a specific wavelength. By selecting optical characteristics (light transmittance, etc.) of the dimming plates as appropriate, it is possible to adjust an amount of external light made incident on the right optical-image display section 526 and the left optical-image display section 528 from the outside and adjust easiness of visual recognition of a virtual image. In the following explanation in this embodiment, dimming plates at least having light transmissivity enough for the user wearing the image display section 520 to visually recognize an outside scene are used. The dimming plates protect a right light guide plate and a left light guide plate, which are optical elements, and prevent damage, adhesion of stain, and the like to the right light guide plate and the left light guide plate. The dimming plates may be detachably attachable to the right optical-image display section 526 and the left optical-image display section 528. A plurality of kinds of dimming plates may be able to be replaced and attached. The dimming plates may be omitted.

A camera unit 503 is provided in the frame 502. The camera unit 503 includes a camera pedestal section 503C on which an upper camera 561 is disposed and arm sections 503A and 503B configured to support the camera pedestal section 503C. The arm section 503A is turnably coupled to the right holding section 521 by a hinge 521A provided at a distal end portion AP of the right holding section 521. The arm section 503B is turnably coupled to the left holding section 523 by a hinge 523A provided at a distal end portion AP of the left holding section 523. Therefore, the camera unit 503 as a whole is turnable in a direction indicated by arrows K in FIG. 23, that is, up and down in a mounted state of the head-mounted display device. The camera unit 503 is in contact with the frame 502 at a lower end of a turning range. An upper end of the turning range of the camera unit 503 is determined by, for example, specifications of the hinges 521A and 523A.

The camera pedestal section 503C is a plate-like or bar-like member located across upper parts of the right section 502A, the left section 502B, and the bridge section 502C. The upper camera 561 is embedded and set in a position above the bridge section 502C. The upper camera 561 is a digital camera including an imaging element such as a CCD or a CMOS and an imaging lens. The upper camera 561 may be a monocular camera or may be a stereo camera.

The upper camera 561 images at least a part of an outside scene in a front side direction of the head-mounted display device 5000, in other words, a visual field direction of the user in a state in which the user wears the image display section 520. The width of an angle of view of the upper camera 561 can be set as appropriate. However, for example, at the lower end of the turning range of the camera unit 503, an imaging range of the upper camera 561 desirably includes an external world visually recognized by the user through the right optical-image display section 526 and the left optical-image display section 528. Further, the imaging range of the upper camera 561 is more desirably set such that the upper camera 561 can image an entire visual field of the user through the dimming plates.

The image display section 520 is coupled to the control device 510 via a coupling section 540. The coupling section 540 includes a main body cord 548 coupled to the control device 510, a right cord 542, a left cord 544, and a coupling member 546. The right cord 542 and the left cord 544 are two cords branching from the main body cord 548. The right cord 542 is inserted into a housing of the right holding section 521 from the distal end portion AP in the extending direction of the right holding section 521 and coupled to the right display driving section 522. Similarly, the left cord 544 is inserted into a housing of the left holding section 523 from the distal end portion AP in the extending direction of the left holding section 523 and coupled to the left display driving section 524.

The coupling member 546 is provided at a branching point of the main body cord 548 and the right cord 542 and the left cord 544. The coupling member 546 includes a jack for coupling an earphone plug 530. Cords of a right earphone 532 and a left earphone 534 extend from the earphone plug 530. The microphone 563 is provided in the vicinity of the earphone plug 530. The cords are collected as one cord from the earphone plug 530 to the microphone 563. The cords branch from the microphone 563 and are respectively coupled to the right earphone 532 and the left earphone 534.

The microphone 563 is disposed such that a sound collecting section of the microphone 563 faces a visual line direction of the user. The microphone 563 collects sound and outputs a sound signal to a sound processing section (not shown in FIG. 23). The microphone 563 may be, for example, a monaural microphone or may be a stereo microphone, may be a microphone having directivity, or may be a nondirectional microphone.

The right cord 542, the left cord 544, and the main body cord 548 only have to be cords capable of transmitting digital data and can be configured by, for example, a metal cable or an optical fiber. The right cord 542 and the left cord 544 may be collected as one cord.

The image display section 520 and the control device 510 transmit various signals via the coupling section 540. Connectors (not shown in FIG. 23) that fit with each other are provided at the end portion of the main body cord 548 on the opposite side of the coupling member 546 and the control device 510. The control device 510 and the image display section 520 can be coupled and separated by fitting the connector of the main body cord 548 and the connector of the control device 510 and releasing the fitting.

The control device 510 controls the head-mounted display device 5000. The control device 510 includes a determination key 511, a lighting section 512, a display switching key 513, a luminance switching key 515, a direction key 516, a menu key 517, and switches including a power switch 518. The control device 510 includes a track pad 514 that the user operates with a finger.

The determination key 511 detects pressing operation and outputs a signal for determining content of operation by the control device 510. The lighting section 512 includes a light source such as an LED (Light Emitting Diode) and notifies, with a lighting state of the light source, an operation state (e.g., ON/OFF of a power supply) of the head-mounted display device 5000. The display switching key 513 outputs, according to pressing operation, for example, a signal for instructing switching of a display mode of an image.

The track pad 514 includes an operation surface on which touch operation is detected and outputs an operation signal according to operation on the operation surface. A detection type on the operation surface is not limited. An electrostatic type, a pressure detection type, an optical type, and the like can be adopted. The luminance switching key 515 outputs, according to pressing operation, a signal for instructing an increase and a decrease in the luminance of the image display section 520. The direction key 516 outputs operation signals according to pressing operation of the key corresponding to upper, lower, left, and right directions. The power switch 518 is a switch that switches ON/OFF of the power supply of the head-mounted display device 5000.

Two motion sensors are attached to the frame 502. The motion sensors in this embodiment are inertial sensors and are specifically a first sensor 566 functioning as a first sensor unit and a second sensor 568 functioning as a second sensor unit. The acceleration sensor 100 can be applied as the first sensor 566 and the second sensor 568. The first sensor 566 is disposed at the end on the temple section 502D side in the right section 502A. The second sensor 568 is disposed at the end on the temple section 502E side in the left section 502B. That is, the first sensor 566 and the second sensor 568 are located further on one side than the center of the head in amounted state of the head-mounted display device 5000. The first sensor 566 and the second sensor 568 are inertial sensors such as an acceleration sensor and an angular velocity sensor (a gyro sensor). In this embodiment, the three-axis gyro sensor and the three-axis acceleration sensor are used. The first sensor 566 and the second sensor 568 respectively detect, at measurement reference points of incorporated detecting mechanisms, for example, rotation (a pitch) around the X axis, rotation (a yaw) around the Y axis, and rotation (a roll) around the Z axis.

One sensor of the first sensor 566 and the second sensor 568 is present on one side of the center of the head of the user. The other sensor is present on the other side of the center of the head of the user. Specifically, the first sensor 566 is present on the right side of the head of the user. The second sensor 568 is present on the left side of the head of the user. In this embodiment, the center of the head indicates the center of the head on a horizontal plane perpendicular to the height of the user. The positions on the horizontal plane of the first sensor 566 and the second sensor 568 are present on the right side and the left side across the center of the head on the horizontal plane.

The head-mounted display device 5000 functioning as an example of the display device having such a configuration includes the image display section 520 configured to irradiate image light on the eyes of the user and the first sensor 566 and the second sensor 568 functioning as a plurality of motion sensors. One of the first sensor 566 and the second sensor 568 is located further on one side than the center of the head in the mounted state. The other motion sensor is located further on the other side than the center of the head in the mounted state. Therefore, when the head of the user moves, it is possible to quickly calculate a movement amount, a direction of the movement, and the like in a motion center.

In the head-mounted display device 5000, one of the first sensor 566 and the second sensor 568 is located further on the left side than the center of the head in the mounted state. The other motion sensor is located further on the right side than the center of the head in the mounted state. Therefore, it is possible to quickly calculate a movement in the motion center of the head based on detection results of the motion sensors.

Such a head-mounted display device 5000 functioning as an example of the display device has excellent reliability because the head-mounted display device 5000 includes the acceleration sensor 100 functioning as the physical quantity sensor as the first sensor 566 and the second sensor 568.

The physical quantity sensor (100), the composite sensor 900, the inertial measurement unit 2000, the vehicle positioning device 3000, the portable electronic device (1000), the electronic device (1100, 1200, 1300), the vehicle (1500), the traveling supporting system 4000, and the display device (5000) are explained above based on the embodiments shown in the figures. However, the present disclosure is not limited to the embodiments. The components of the sections can be replaced with any components having the same functions. Any other components may be added to the present disclosure.

In the embodiments explained above, the X axis, the Y axis, and the Z axis are orthogonal to one another. However, the X axis, the Y axis, and the Z axis are not limited to this if the X axis, the Y axis, and the Z axis cross one another. For example, the X axis may slightly tilt with respect to the normal direction of a YZ plane. The Y axis may slightly tilt with respect to the normal direction of an XZ plane. The Z axis may slight tilt with respect to the normal direction of an XY plane. "Slightly" means a range in which the acceleration sensor 100 can exert the effects of the acceleration sensor 100. A specific tilt angle (a numerical value) is different depending on a configuration and the like.

Contents derived from the embodiments explained above are described below as aspects.

First Aspect

A physical quantity sensor according to a first aspect includes: a physical quantity sensor element including a substrate, a lid joined to the substrate to form a housing space in an inside, and a physical quantity sensor element piece housed in the housing space and capable of detecting a physical quantity; and a circuit element bonded to a surface of the lid via an adhesive material, the surface being a surface on an opposite side of a side of the physical quantity sensor element piece. A recess is provided along an outer edge of the lid in an outer edge region of the surface on the opposite side of the lid.

According to this aspect, the recess is provided along the outer edge of the lid in the outer edge region of the surface on which the circuit element of the lid of the physical quantity sensor element is bonded. Therefore, when the circuit element is bonded to the lid, even if an excess adhesive material flows out along the surface of the lid, the flowing-out adhesive material can be held up in the recess. Therefore, it is possible to prevent the adhesive material flowing out along the side surface of the lid from being held up in a state in which the flowing-out adhesive material is in contact with the adhesive material that attaches the physical quantity sensor element to a package and the like. Therefore, it is possible to prevent stress and distortion that occur because of hardening of the adhesive material from being transmitted to the physical quantity sensor element via the adhesive material that attaches the physical quantity sensor element. Since the influence of the stress and the distortion on the physical quantity sensor element can be reduced, for example, it is possible to prevent a bias output signal output from the physical quantity sensor element from fluctuating.

Second Aspect

In the physical quantity sensor according to the first aspect, the recess may be a step section.

According to this aspect, since the recess is the step section, when the circuit element is bonded to the lid, even if an excess adhesive material flows out along the surface of the lid, the flowing-out adhesive material can be held up in the step section. Therefore, it is possible to prevent stress and distortion that occur because of hardening of the adhesive material from being transmitted to the physical quantity sensor element via the adhesive material that attaches the physical quantity sensor element. Since the influence of the stress and the distortion on the physical quantity sensor element can be reduced, for example, it is possible to reduce fluctuation of the bias output signal output from the physical quantity sensor element.

Third Aspect

In the physical quantity sensor according to the first aspect, the recess may be a bottomed hole.

According to this aspect, since the recess is the bottomed hole, when the circuit element is bonded to the lid, an excess adhesive material can be held up in the hole. Therefore, it is possible to prevent stress and distortion that occur because of hardening of the adhesive material from being transmitted to the physical quantity sensor element via the adhesive material that attaches the physical quantity sensor element. Since the influence of the stress and the distortion on the physical quantity sensor element can be reduced, for example, it is possible to reduce fluctuation of the bias output signal output from the physical quantity sensor element.

Fourth Aspect

In the physical quantity sensor according to the third aspect, width of the bottomed hole may decrease from a surface side on the circuit element side of the lid toward the substrate side.

According to this aspect, the recess is the bottomed hole and the width of the hole decreases from the surface side on the circuit element side of the lid toward the substrate side. Therefore, when the circuit element is bonded to the lid, the adhesive material more easily flows into the hole. An excess adhesive material can be held up in the hole. Therefore, it is possible to prevent stress and distortion that occur because of hardening of the adhesive material from being transmitted to the physical quantity sensor element via the adhesive material that attaches the physical quantity sensor element. Since the influence of the stress and the distortion on the physical quantity sensor element can be reduced, for example, it is possible to reduce fluctuation of the bias output signal output from the physical quantity sensor element.

Fifth Aspect

In the physical quantity sensor according to the fourth aspect, a wall surface of the bottomed wall may be an inclined surface.

According to this aspect, the recess is the bottomed hole and the wall surface of the hole is the inclined surface. Therefore, when the circuit element is bonded to the lid, the adhesive material easily flows into the hole. An excess adhesive material can be held up in the hole. Therefore, it is possible to prevent stress and distortion that occur because of hardening of the adhesive material from being transmitted to the physical quantity sensor element via the adhesive material that attaches the physical quantity sensor element. Since the influence of the stress and the distortion on the physical quantity sensor element can be reduced, for example, it is possible to reduce fluctuation of the bias output signal output from the physical quantity sensor element.

Sixth Aspect

In the physical quantity sensor according to the first aspect, the lid may have a square shape, and the recess may be provided at least on a pair of sides of the lid.

According to this aspect, the lid has the square shape and the recess is provided at least on the pair of sides of the lid. Therefore, when the circuit element is bonded to the lid, even if the adhesive material flows out to both sides of the circuit element, an excess adhesive material can be held up in the recess. Therefore, it is possible to prevent stress and distortion that occur because of hardening of the adhesive material from being transmitted to the physical quantity sensor element via the adhesive material that attaches the physical quantity sensor element. Since the influence of the stress and the distortion on the physical quantity sensor element can be reduced, for example, it is possible to reduce fluctuation of the bias output signal output from the physical quantity sensor element.

Seventh Aspect

In the physical quantity sensor according to the first aspect, the physical quantity may be acceleration.

According to this aspect, it is possible to detect highly accurate acceleration data with reduced fluctuation of the bias output signal that occurs because of instability of a bonding state of the physical quantity sensor element.

Eighth Aspect

A composite sensor according to an eighth aspect of the present disclosure includes: the physical quantity sensor according to the seventh aspect; and an angular velocity sensor.

According to this aspect, it is possible to obtain the composite sensor that can enjoy the effects of the physical quantity sensor explained above and has high inertial measurement accuracy.

Ninth Aspect

An inertial measurement unit according to a ninth aspect of the present disclosure includes: the physical quantity sensor according to the seventh aspect; an angular velocity sensor; and a control section configured to control the physical quantity sensor and the angular velocity sensor.

According to this aspect, it is possible to obtain the inertial measurement unit that can enjoy the effects of the physical quantity sensor explained above and has high inertial measurement accuracy.

Tenth Aspect

A vehicle positioning device according to a tenth aspect of the present disclosure includes: the inertial measurement unit according to the ninth aspect; a receiving section configured to receive a satellite signal superimposed with position information from a positioning satellite; an acquiring section configured to acquire, based on the received satellite signal, position information of the receiving section; a computing section configured to compute, based on inertia data output from the inertial measurement unit, a posture of a vehicle; and a calculating section configured to calculate a position of the vehicle by correcting the position information based on the calculated posture.

According to this aspect, it is possible to obtain the vehicle positioning device that can enjoy the effects of the physical quantity sensor explained above and has high inertial measurement accuracy.

Eleventh Aspect

A portable electronic device according to an eleventh aspect of the present disclosure includes: the physical quantity sensor according to any one of the first to seventh aspects; a case in which the physical quantity sensor is housed; a processing section housed in the case and configured to process a detection signal output from the physical quantity sensor; a display section housed in the case; and a light-transmissive cover closing an opening section of the case.

According to this aspect, it is possible to obtain the portable electronic device that can enjoy the effects of the physical quantity sensor explained above and has high inertial measurement accuracy.

Twelfth Aspect

The portable electronic device according to the eleventh aspect may include a satellite positioning system and measure a moving distance and a moving track of a user.

According to this aspect, convenience of the portable electronic device is improved.

Thirteenth Aspect

An electronic device according to a thirteenth aspect of the present disclosure includes: the physical quantity sensor according to any one of the first to seventh aspects; and a control section configured to perform control based on a detection signal output from the physical quantity sensor.

According to this aspect, it is possible to obtain the electronic device that can enjoy the effects of the physical quantity sensor explained above and has high inertial measurement accuracy.

Fourteenth Aspect

A vehicle according to a fourteenth aspect of the present disclosure includes: the physical quantity sensor according to any one of the first to seventh aspects; and a control section configured to perform control based on a detection signal output from the physical quantity sensor.

According to this aspect, it is possible to obtain the vehicle that can enjoy the effects of the physical quantity sensor explained above and has high inertial measurement accuracy.

Fifteenth Aspect

The vehicle according to the fourteenth aspect may include at least one system of an engine system, a brake system, and a keyless entry system, and the control section may control the system based on the detection signal.

According to this aspect, it is possible to accurately control at least anyone system of the engine system, the brake system, and the keyless entry system.

Sixteenth Aspect

A traveling supporting system according to a sixteenth aspect of the present disclosure includes: the physical quantity sensor according to any one of the first to seventh aspects; and a control section configured to control at least one of acceleration, braking, and steering based on a detection signal output from the physical quantity sensor. Implementation and non-implementation of automatic driving is switched according to a change of the detection signal output from the physical quantity sensor.

According to this aspect, with the control section configured to control at least any one of acceleration, braking, and steering, it is possible to accurately switch implementation or non-implementation of the automatic driving according to a change of the detection signal detected by the physical quantity sensor.

Seventeenth Aspect

A display device according to a seventeenth aspect of the present disclosure includes: a display section worn on a head of a user and configured to irradiate image light on eyes of the user; and the physical quantity sensor according to any one of the first to seventh aspects. The physical quantity sensor includes: a first sensor unit located further on one side than a center of the head in a worn state; and a second sensor unit located further on another side than the center of the head.

According to this aspect, in the display device, the physical quantity sensor includes the first sensor unit located further on one side than the center of the head in the worn state and the second sensor unit located further on the other side than the center of the head. Therefore, when the head of the user moves, it is possible to quickly calculate a movement amount, a direction of the movement, and the like in a motion center. It is possible to obtain the display device that can enjoy the effects of the physical quantity sensor explained above and has high inertial measurement accuracy.

What is claimed is:

1. A physical quantity sensor comprising:
three axes orthogonal to each other being defined as an X-axis, a Y-axis, and a Z-axis;
a physical quantity sensor element, the physical quantity sensor element being configured with:
a substrate, the substrate being rectangular-shaped extending along the X-axis and the Y-axis, the substrate having first, second, third, and fourth sides, the first side and the second side being opposite to each other along the X-axis, the third side and the fourth side being opposite to each other along the Y-axis, the substrate having a thickness along the Z-axis, the substrate having a first area on a top surface adjacent to the first side of the substrate;

a lid joined to the substrate to form a housing space, the lid being rectangular-shaped, the lid having first, second, third, and fourth sides, the second, third, and fourth sides of the lid aligning with the second, third, and fourth sides of the substrate, the first area of the top surface of the substrate being free of the lid, the first area of the top surface of the substrate being located at an outside of the housing space;

a physical quantity sensor element piece housed in the housing space and configured to detect a physical quantity; and a terminal electrode being formed on the first area of the top surface of the substrate; and a circuit element bonded on a top surface of the lid, wherein a first recess is formed in the top surface of the lid, and the first recess extends along an outer edge of the first side of the lid, a second recess is formed in the top surface of the lid, and the second recess extends along an outer edge of the third side of the lid, and a third recess is formed in the top surface of the lid, and the third recess extends along an outer edge of the fourth side of the lid.

2. The physical quantity sensor according to claim 1, wherein each of the first, second, and third recesses is a step section.

3. The physical quantity sensor according to claim 1, wherein each of the first, second, and third recesses is a bottomed hole.

4. The physical quantity sensor according to claim 3, wherein the bottomed hole is tapered along the Z-axis, and
a width of an opening of the bottomed hole is larger than a width of a bottom of the bottomed hole.

5. The physical quantity sensor according to claim 4, wherein a wall surface of the bottomed hole is an inclined surface.

6. The physical quantity sensor according to claim 1, wherein the physical quantity is acceleration.

7. A composite sensor comprising:
the physical quantity sensor according to claim 6; and
an angular velocity sensor.

8. An inertial measurement unit comprising:
the physical quantity sensor according to claim 6;
an angular velocity sensor; and
a control section configured to control the physical quantity sensor and the angular velocity sensor.

9. An electronic device comprising:
the physical quantity sensor according to claim 1; and
a control section configured to perform control based on a detection signal output from the physical quantity sensor.

10. A vehicle comprising:
the physical quantity sensor according to claim 1; and
a control section configured to perform control based on a detection signal output from the physical quantity sensor.

* * * * *